United States Patent
Loering et al.

(10) Patent No.: US 8,228,483 B2
(45) Date of Patent: Jul. 24, 2012

(54) PROJECTION OBJECTIVE FOR MICROLITHOGRAPHY, PROJECTION EXPOSURE APPARATUS, PROJECTION EXPOSURE METHOD AND OPTICAL CORRECTION PLATE

(75) Inventors: Ulrich Loering, Oberkochen (DE); Gerd Reisinger, Oberkochen (DE); Franz-Josef Stickel, Aalen (DE); Sonja Schneider, Oberkochen (DE); Johann Trenkler, Schwaebisch Gmuend (DE); Stefan Kraus, Aalen (DE); Gordon Doering, Hamburg (DE); Aksel Goehnermeier, Essingen-Lauterburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 354 days.

(21) Appl. No.: 12/698,242

(22) Filed: Feb. 2, 2010

(65) Prior Publication Data

US 2010/0195070 A1 Aug. 5, 2010

Related U.S. Application Data

(63) Continuation of application No. PCT/EP2008/005898, filed on Jul. 18, 2008.

(60) Provisional application No. 60/953,886, filed on Aug. 3, 2007.

(51) Int. Cl.
 *G03B 27/68* (2006.01)
(52) U.S. Cl. ............... 355/52; 355/67; 355/71
(58) Field of Classification Search ............ 355/52, 355/67, 71
 See application file for complete search history.

(56) References Cited

U.S. PATENT DOCUMENTS

| | | |
|---|---|---|
| 6,191,898 B1 | 2/2001 | Trunz et al. |
| 6,268,903 B1 | 7/2001 | Chiba et al. |
| 6,275,344 B1 | 8/2001 | Holderer |

(Continued)

FOREIGN PATENT DOCUMENTS

EP  660 169  6/1995

(Continued)

OTHER PUBLICATIONS

The International Preliminary Report on Patentability for the corresponding PCT Application No. PCT/EP2008/005898, mailed Feb. 18, 2010.

(Continued)

*Primary Examiner* — Thomas R Artman
(74) *Attorney, Agent, or Firm* — Fish & Richardson P.C.

(57) ABSTRACT

A projection objective is disclosed. The projection objective can include a plurality of optical elements arranged to image a pattern from an object field in an object surface of the projection objective to an image field in an image surface of the projection objective with electromagnetic operating radiation from a wavelength band around an operating wavelength $\lambda$. The plurality of optical elements can include an optical correction plate that includes a body comprising a material transparent to the operating radiation, the body having a first optical surface, a second optical surface, a plate normal substantially perpendicular to the first and second optical surfaces, and a thickness profile defined as a distance between the first and second optical surfaces measured parallel to the plate normal. The first optical surface can have a non-rotationally symmetric aspheric first surface profile with a first peak-to-valley value $PV1 > \lambda$. The second optical surface can have a non-rotationally symmetric aspheric second surface profile with a second peak-to-valley value $PV2 > \lambda$. A thickness of the optical correction plate can vary by less than $0.1*(PV1+PV2)/2$ across the optical correction plate.

20 Claims, 16 Drawing Sheets

U.S. PATENT DOCUMENTS

| | | | |
|---|---|---|---|
| 6,307,618 B1 * | 10/2001 | Suzuki et al. | 355/53 |
| 6,373,552 B1 | 4/2002 | Braat et al. | |
| 6,788,389 B2 * | 9/2004 | Fujishima et al. | 355/67 |
| 6,831,731 B2 * | 12/2004 | Omura et al. | 355/67 |
| 6,958,803 B2 * | 10/2005 | Sasaya et al. | 355/55 |
| 7,190,527 B2 | 3/2007 | Rostalski et al. | |
| 2001/0038446 A1 * | 11/2001 | Takahashi | 355/67 |
| 2002/0086224 A1 | 7/2002 | Kanda | |
| 2002/0126266 A1 | 9/2002 | Braat et al. | |
| 2003/0071986 A1 | 4/2003 | Geh et al. | |
| 2005/0122499 A1 * | 6/2005 | Omura et al. | 355/67 |
| 2005/0190435 A1 | 9/2005 | Shafer et al. | |
| 2006/0274934 A1 | 12/2006 | Boesser et al. | |
| 2010/0195070 A1 * | 8/2010 | Loering et al. | 355/52 |

FOREIGN PATENT DOCUMENTS

| | | |
|---|---|---|
| EP | 678 768 | 10/1995 |
| EP | 851 304 | 7/1998 |
| EP | 1 772 775 | 4/2007 |
| WO | WO 03/075096 | 9/2003 |
| WO | WO 03/092256 | 11/2003 |
| WO | WO 2005/033800 | 4/2005 |
| WO | WO 2005/069055 | 7/2005 |

OTHER PUBLICATIONS

Michael J. Kidger, "Fundamental Optical Design", SPIE Press, Bellingham, Washington, USA (Chapter 2), 2002.

* cited by examiner $Z(x,y) = ax^2 + by^2; a \neq b$

PV ≈ 3.47μm

PV ≈ 19.3nm

PROJECTION OBJECTIVE FOR MICROLITHOGRAPHY, PROJECTION EXPOSURE APPARATUS, PROJECTION EXPOSURE METHOD AND OPTICAL CORRECTION PLATE

CROSS-REFERENCE TO RELATED APPLICATIONS

This application is a continuation of, and claims benefit under 35 USC 120 to, international application PCT/EP2008/005898, filed Jul. 18, 2008, which claims benefit of U.S. Ser. No. 60/953,886, filed Aug. 3, 2007. International application PCT/EP2008/005898 is hereby incorporated by reference in its entirety.

FIELD

The disclosure relates to a projection objective for microlithography. The disclosure additionally relates to a projection exposure apparatus for microlithography. The disclosure additionally relates to a method of fabricating semiconductor devices and other types of microdevices utilizing a projection objective for microlithography. The disclosure additionally relates to an optical correction plate that may be used as an exchangeable element for a projection objective for microlithography.

BACKGROUND

Microlithographic projection exposure methods and systems (machines) are currently used to fabricate semiconductor components and other finely patterned components. A microlithographic exposure process involves using a mask (reticle) that carries or forms a pattern of a structure to be imaged. The pattern is positioned in a projection exposure system between an illumination system and a projection objective in a region of the object surface of the projection objective. Primary radiation is provided by a primary radiation source and transformed by optical components of the illumination system to produce illumination radiation directed at the pattern of the mask in an illuminated field. The radiation modified by the mask and the pattern passes through the projection objective, which forms an image of the pattern in the image surface of the projection objective, where a substrate to be exposed is arranged. The substrate normally carries a radiation-sensitive layer (photoresist).

When a microlithographic projection exposure system is used in the manufacture of integrated circuits, the mask (reticle) may contain a circuit pattern corresponding to an individual layer of the integrated circuit. This pattern can be imaged onto an exposure area on a semiconductor wafer which serves as a substrate.

In one class of microlithographic projection exposure systems each exposure area is irradiated by exposing the entire pattern of the reticle onto the exposure area at once. Such apparatuses are commonly referred to as wafer steppers.

In alternative exposure systems commonly referred to as step-and-scan apparatus or wafer scanner, each exposure area is irradiated progressively in a scanning operation by moving the mask relative to an illumination beam in an effective object field of the projection objective, and simultaneously moving the substrate relative to the projection beam in the conjugate effective image field of the projection objective in respective scanning directions. The mask is typically held in place by a mask holder, which is movable parallel to the object surface of the projection objective in a scanning apparatus. The substrate is typically held by a substrate holder, which is movable parallel to the image surface in a scanning apparatus. The scanning directions may be parallel to each other or anti-parallel to each other, for example.

The projection objective defines, in general, an optical axis with reference to which the optical elements that belong to the projection objective are arranged. Generally, these optical elements are rotationally symmetrical relative to this optical axis, and the optical axis is a normal to the object field and image field. In this case, the design of the projection objective is denoted as being rotationally symmetrical. Such a rotationally symmetrical design does not in general imply that all optical elements in the physical implementation of the projection objective desirably is designed to be rotationally symmetrical. In the case of folded projection objectives, and/or in the case of catadioptric projection objectives, with on-axis object field or off-axis object field, the foldings and penetrations of the beam path may involve cutouts in optical elements, and/or optical elements that serve solely for beam deflection such as, for example, folding mirrors, and which have no refractive power.

During the exposure of the wafer, the projection exposure machine is operated with a prescribed image-side numerical aperture NA, also termed "numerical aperture" below for short, and with a setting (illumination setting) prescribed by the illumination system, for example an incoherent, annular, dipole or quadrupole illumination setting. The numerical aperture NA is defined by the position and the diameter of a diaphragm (aperture stop) in the projection objective. Common numerical apertures for projection objectives for microlithography are 0.5, 0.6, 0.7, 0.8, or 0.9 and values in between, for example. In the case of projection exposure machines that are designed for immersion operation, the numerical aperture may increase by approximately 50%, for example. The illumination setting is generally prescribed by optical elements of the illumination system such as the diffractive optical elements.

At each instant of the exposure, a maximum radiation bundle cut by the diaphragm passes from the effective object field to the effective image field from each field point belonging to the effective object field. In an ideal projection objective whose aberrations (also referred to as imaging errors) are determined only by the design, the wavefront, defined by this maximum radiation bundle, in the vicinity of the image point belonging to the object field point corresponds approximately to a spherical wave with the image point as midpoint. Such projection objectives are therefore also termed diffraction limited.

In general, during the exposure the projection objective is aligned with its optical axis in the direction of gravity. The generally planar reticle is in this case aligned horizontally, i.e. parallel to the object field of the projection objective. A consequence of this is that the reticle sags owing to the force of gravity, the sagging being a function of the type of the reticle and of the mounting technique securing the reticle, and is not known a priori or is difficult to determine. This deformation of the reticle caused by sagging of the reticle has the consequence that the position of the individual locations on the reticle that are to be imaged are displaced in a way that cannot be completely predicted a priori, the direction and length of this displacement themselves in turn being a function of the location on the reticle. What is involved here are pure spatial displacements that are not accompanied by a pupil error, or accompanied only by a vanishingly small pupil error.

A similar situation may be caused on the image side, e.g. on the side of the wafer. The problem may be of lesser importance there, since a wafer can typically be supported from below. Such a support is difficult to obtain for the reticle, as a matter of course.

A further cause for possible sagging of the reticle is the direct influence on the reticle of its mounting technique. Here, there generally occur forces and moments caused by bearings and/or clamps acting on the reticle. These are, a priori, likewise not fully known, and can differ from reticle to reticle, but they can also be identical for classes of reticle.

SUMMARY

It can desirable to distinguish system-specific aspects of the reticle sagging, that is to say sagging that is the same for each reticle, and aspects of reticle sagging not system-specific, that is to say sagging that induces different instances of sagging for different reticles.

It can therefore desirable to adjust for these displacements induced by the system spatial-specific aspects of the reticle sagging, which are not accompanied by any pupil error, and to render variable this adjustment possibility because these spatial displacements change, in turn, in the event of a reticle change, which may change the mounting forces and mounting moments.

In addition, it can generally be a result of such a reticle change that the structures located on it and to be imaged change, and/or that use is made of another illumination setting for projecting this new reticle. During operation of the projection exposure machine, this may exert an additional influence the temperature object of the projection objective, and thus also on an approximately pure pupil error of the projection objective.

In the event of a change of the reticle, it therefore follows that the operation of the projection exposure machine may additionally result in approximately pure pupil errors that need to be corrected/adjusted for independently of the sagging of the reticle.

In some embodiments, the disclosure provides a projection objective for microlithography that adjusts for the spatial displacements mentioned above, or keeps them capable of correction, without changing the pupil error of the projection objective in a way dependent thereon, and which can at the same time correct or adjust for a pupil independently thereof.

In certain embodiments, the disclosure provides a projection objective for microlithography that adjusts for the spatial displacements mentioned above, or keeps them capable of correction, with the aid of a single correction possibility, without changing the pupil error of the projection objective.

In some embodiments, the provides a projection exposure machine for microlithography in which the spatial displacements mentioned above can be adjusted for or corrected without changing the pupil error of the projection objective belonging to the projection exposure machine in a way dependent thereon, and which can at the same time correct or adjust for a pupil error, independent thereof, of the projection objective belonging to the projection exposure machine.

In certain embodiments, the disclosure provides a method for operating a projection exposure machine for microlithography that provides, in the event of a change of reticle, a possibility of correction with the aid of which the changing spatial displacements can be corrected and/or adjusted for without changing the pupil error in a way that is dependent thereon, and which at the same time can correct/adjust for a pupil error independent of the spatial displacements.

In some embodiments, the disclosure provides exchangeable elements for projection objectives for microlithography with the aid of which it is possible to compensate or adjust for the altered spatial displacements, which occur in the event of a reticle change, without altering the pupil error in a way dependent thereon, and which at the same time can correct/ adjust for a pupil error independent of these spatial displacements.

In certain embodiments, the disclosure provides exchangeable elements for projection objectives for microlithography with the aid of which it is possible to correct distortion characteristics substantially without introducing higher aberration terms, such as coma profiles.

In some embodiments, a projection objective includes a plurality of optical elements arranged to image a pattern from an object field in an object surface of the projection objective to an image field in an image surface of the projection objective with electromagnetic operating radiation from a wavelength band around an operating wavelength $\lambda$. The optical elements includes an optical correction plate that includes a body made from a material transparent to the operating radiation, where the body has a first optical surface, a second optical surface, a plate normal substantially perpendicular to the first and second optical surface, and a thickness profile of a plate thickness defined as a distance between the first and second optical surface measured parallel to the plate normal.

The first optical surface and the second optical surface are similar in that: the first optical surface has a non-rotationally symmetric aspheric first surface profile with a first peak-to-valley value $PV1 > \lambda$; the second optical surface has a non-rotationally symmetric aspheric second surface profile with a second peak-to-valley value $PV2 > \lambda$; and the plate thickness varies by less than $0.1*(PV1+PV2)/2$ across the optical correction plate.

The region in which the peak-to-valley values are determined is the region which may be used in operation to influence the rays passing through the respective surfaces, i.e. the region which is prepared with optical quality. The region may be denoted as an optically free region, or as a useful or usable cross-section of the correction plate, for example. The region does not include peripheral regions of the correction plate used for mounting the plate.

It is known to equip projection objectives for microlithography with compensation mechanisms that are intended to compensate image errors (i.e. aberrations) that arise with the imaging of the reticle.

Thus, U.S. Pat. No. 6,275,344 B1 and U.S. Pat. No. 6,191, 898 B1 show manipulators that can displace a lens of the projection objective relative to its optical axis. EP 678 768 B1 shows a manipulator that bends the shape of a lens, or tilts the lens or heats or cools it. EP 660 169 B1 shows a manipulator that rotates two aspheric lenses relative to one another. Two aspheric lenses are displaced relative to one another in EP 851 304 B1. In U.S. Pat. No. 6,268,903 B1, an aspherized plane plate is introduced into the projection objective in the vicinity of the image field and is capable of adjusting for a spatial displacement dependent on location. However, since as a matter of course the plate cannot be displaced fully into the image plane, such an aspherized plane plate cannot be introduced into the projection objective without inducing a pupil error.

In US 2002/0126266 A1 (corresponding e.g. to U.S. Pat. No. 6,373,552 B1), a plane plate aspherized on both sides is brought between the projection objective and the wafer in order to compensate distortion characteristics. The aspheres on the top and on the underside of this plane plate are identical, and the plane plate has uniform thickness so that the field curvature of the projection objective remains unchanged. Such a manipulation of the distortion characteristics provides a mechanism that attacks image errors (aberrations) induced by the sagging of the reticle, but this is also not free here from pupil errors, and the correction of the distortion characteristics is accompanied by higher terms, such as coma profiles.

It is common to all these options for manipulation and adjustment that they influence the pupil error of the projection objective, something which may not be desired for solving specific problems.

WO 2005/033800 A1 shows lenses in projection objectives that are aspherized on both sides. These aspheres are rotationally symmetrical with reference to the optical axis and can therefore at best partially compensate a purely rotationally symmetrical sagging of the reticle.

WO 2003/092256 A2 shows an optical element which is positioned in the vicinity of the field and has an angle-sensitive filtering effect. In a way corresponding to the object present there, this effect is a virtually exclusive influence on the pupil error.

In the disclosure according to the above formulation the projection objective includes an optical correction plate having a specific physical structure and shape, which is arranged within the projection objective at a predefined position along the optical path from an entry surface of the projection objective to an exit surface of the projection objective, i.e. not outside the projection objective. Considering that a minimum axial space is normally involved between the position of the reticle (in the object surface of the projection objective) and the entry surface of the projection objective, such optical correction plate cannot be placed very close to the reticle. The inventors have found a way of making it possible for an optical correction plate to induce, for example, a dominant field aberration without necessarily inducing undesired pupil aberrations. This effect is made possible if each of the first and second optical surface has a non-rotationally symmetric aspheric surface profile and a thickness profile of the correction plate is suitably adapted to the optical position of the correction plate within the projection objective.

In the formulation of the disclosure given above the term "optical surface" generally relates to an optically effective surface having surfaces properties specifically configured to cause the desired refractive effect on a radiation beam passing through the optical surface. Each of the first and second optical surfaces has a non-rotationally symmetric aspheric surface profile, also referred to as "rotationally asymmetric" surface profile or rotationally asymmetric shape. The terms "non-rotationally symmetric" or "rotationally asymmetric" are used interchangeably. Also, the terms "surface profile" and "surface shape" are used interchangeably. A shape may be referred to as being rotationally asymmetric (or non-rotationally symmetric) with respect to a given reference axis of rotation if there exists at least one angle such that a rotation about that angle and reference axis results in a different shape. Here shape has to be understood relative to a fixed coordinate system which does not rotate during the above rotation. Specifically, a shape is referred to as having an n-fold (rotational) symmetry if there is only a finite number of n angles for which the rotation around the reference axis results in the same shape. A shape having an n-fold rotational symmetry is nevertheless rotationally asymmetric, because rotational symmetry involves a shape is invariant to any angular rotation about an axis of rotational symmetry. A shape having n-fold rotational symmetry is also referred to as a shape having n-fold radial symmetry.

The term "plate" as used herein generally refers to an optical element having a relatively flat overall shape having a thickness significantly smaller than a diameter of the plate, where two optical surfaces forming an entry surface and an exit surface, respectively, of the plate run substantially parallel to each other on a macroscopic scale. In a plane parallel plate the plate normal has an orientation which is independent of the position across the plate.

According to the formulation given above, each of the first and second optical surface has a well-defined surface shape where the highest point and the lowest point of a respective optical surface, when seen in the direction of the plate normal, differ by more than the operating wavelength λ. In lithographic applications, for example, the operating wavelength may be in the ultraviolet spectral region at λ<400 nm, e.g. at about 360 nm to 370 nm, or below. The operating wavelength may be in the deep ultraviolet spectral region, for example at λ<260 nm, e.g. at about 248 nm or about 193 nm or about 157 nm or about 126 nm or below. Normally, the operating wavelength will be greater than 100 nm. At the same time, the plate thickness varies by less than 10% of the average peak-to-valley value of the first and second optical surfaces, i.e. (PV1+PV2)/2, across a useful cross-section of the optical correction plate. In an optical correction plate structured according to these conditions, the optical effects of the first optical surface and second optical surface on pupil aberration may substantially compensate each other such that, for example, only a dominant field aberration remains as the residual aberration caused by (or corrected by) the optical correction plate.

The strength of the desired effect on the field aberrations may be increased by increasing the peak-to-valley values of the first and second surface profile. In some embodiments PV1>5*λ and PV2>5*λ, or even PV1>10*λ and PV2>10*λ.

In absolute values, PV1 and/or PV2 may be greater than 100 nm or greater than 500 nm or greater than 1 micrometer or greater than 2 micrometer or greater than 3 micrometer, for example, in applications where the wavelength λ is in the ultraviolet or deep ultraviolet spectral range.

The variation of the plate thickness across the useful cross-section of the optical correction plate may be smaller than 10% of the average peak-to-valley value, for example may be less than 0.05*((PV1+PV2)/2).

In many embodiments the correction plate has a non-uniform thickness profile, which means that any non-uniformity or variation of the thickness-profile is significantly larger than unavoidable thickness variations due to manufacturing tolerances, which may be in the order of 5 nm to 10 nm, for example. In some embodiments the plate thickness varies by more than 5 nm or more than 10 nm or more than 15 nm or more than 20 nm or more than 30 nm or more than 50 nm across the useful cross-section (optically free region) of the optical correction plate. The spatial variation of the plate thickness may be substantially smaller than a micrometer, for example less than 500 nm or less than 300 nm or less than 200 nm. The correction plate may have a uniform thickness profile in some embodiments.

In some embodiments the non-uniform thickness profile has a substantially n-fold radial symmetry with respect to a symmetry axis parallel to the plate normal, where n equal to or greater than 2 is an integer.

With regard to the surface shapes of the first and second optical surface it has been found useful for many applications if each of the first and second surface profile has a substantially n-fold radial symmetry with respect to a symmetry axis parallel to the plate normal, where n≧2 is an integer. For example, the surface profiles may have a 3-fold or 4-fold radial symmetry. The number n may be larger than 4, for example n=5 or n=6 or n=7 or n=8 or more. Superpositions of different n-fold radial symmetric shapes are possible.

In some embodiments each of the first and second optical surfaces has a saddle-shape with the continuous first curvature in a first direction perpendicular to the plate normal and a second curvature with opposite sign in a second direction perpendicular to the plate normal and to the first direction. Correction plates of this type may be used to correct for (or induce) anamorphic distortions with opposite changes of induced magnification error in mutually perpendicular directions.

In some embodiments the dominant field aberration which may be induced (or corrected by) the optical correction plate is a field-variable distortion. In such embodiments, the amount and/or orientation of the distortion varies substantially across the respective field under consideration which is, for example, the effective object field where the pattern of the reticle, or a portion of that pattern, may be arranged.

In some embodiments the dominant field aberration is an anamorphic distortion, which may be considered as a special variant of a field-variable distortion. In such embodiments, an optical system having the same magnification in all planes perpendicular to the optical axis may be transformed to an anamorphic optical system which has a different power or different magnification in different planes containing the optical axis. For example, an optical correction plate inducing an anamorphic distortion may cause an effective distortion in a radially inward direction in one plane containing the optical axis and distortion in a radially outward direction in a plane perpendicular thereto.

An optical correction plate causing an anamorphic distortion as a dominant field aberration may be utilized, for example, in embodiments to correct for saddle-shaped deformations of a reticle.

The correction plate may be arranged optically remote from a field surface of the projection objective, indicating that it is not required for correction plates according to the disclosure to be placed immediately adjacent and very close to the object surface or immediately adjacent or very close to the image surface or, in the case of a projection objective having at least one intermediate image, at or optically very close to an intermediate image.

There are various ways to characterize a position "optically remote from a field surface". In general, it may be useful to define the axial position of optical surfaces, such as surfaces of lenses or mirrors, by the paraxial sub-aperture ratio SAR which is defined here as:

$$SAR=(\text{sign } CRH)(MRH/(|MRH|+|CRH|)).$$

In this definition, parameter MRH denotes the paraxial marginal ray height and parameter CRH denotes the paraxial chief ray height of the imaging process, and the signum function sign(x) denotes the sign of x, in which case sign(0)=1 may be agreed. For the purpose of this application, the term "chief ray" (also known as principle ray) denotes a ray running from an outermost field point (farthest away from the optical axis) of an effectively used object field to the center of the entrance pupil. In rotational symmetric systems the chief ray may be chosen from an equivalent field point in the meridional plane.

In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective objective field is used. Both chief ray and marginal ray are used here in the paraxial approximation. The radial distances between such selected rays and the optical axis at a given axial position are denoted as "chief ray height" (CRH) and "marginal ray height" (MRH), respectively.

A ray height ratio RHR=CRH/MRH may be used as an alternative way to characterize proximity to or distance from field surfaces or pupil surfaces. Positions optically close to a pupil surface (and remote from a field surface) may then be characterized by small absolute values of RHR, for example $|RHR| \leq 0.3$ or $|RHR| \leq 0.2$.

A definition of the paraxial marginal ray and the paraxial chief ray may be found, for example, in: "Fundamental Optical Design" by Michael J. Kidger, SPIE PRESS, Bellingham, Wash., USA (Chapter 2), which document is incorporated herein by reference.

The paraxial sub-aperture ratio as defined here is a signed quantity providing a measure describing the relative proximity of a position along an optical path to a field plane or a pupil plane, respectively. In the definition given above, the paraxial sub-aperture ratio is normalized to values between −1 and 1, where the condition SAR=0 holds for a field plane and a point of discontinuity with a jump from SAR=−1 to SAR=+1 or from SAR=+1 to SAR=−1 corresponds to a pupil plane. Therefore, optical surfaces being positioned optically close to a field plane (such as the object surface or the image surface) are characterized by values of the paraxial sub-aperture ratio close to 0, whereas axial positions optically close to a pupil surface are characterized by absolute values for the paraxial sub-aperture ratio close to 1. The sign of the paraxial sub-aperture ratio indicates the position of the plane optically upstream or downstream of a reference plane. For example, the paraxial sub-aperture ratio a small distance upstream of a pupil surface and a small distance downstream of a pupil surface may have the same absolute value, but opposite signs due to the fact that the chief ray height changes its sign upon transiting a pupil surface. The definition can be made by, for example, the sign of the intersection point of a coma ray on the relevant surface.

Near-field planes (i.e. planes optically close to a field plane) therefore have paraxial sub-aperture ratios that are near 0, while near-pupil planes (i.e. planes optically close to a pupil plane) have paraxial sub-aperture ratios that have absolute values near to 1. Surfaces optically remote from a field surface may be characterized by an absolute amount of the paraxial sub-aperture ratios which is substantially greater than 0, for example $|SAR| \geq 0.5$ or $|SAR| \geq 0.8$.

In some embodiments of the disclosure at least one refractive or reflective optical element with optical power, such as a lens or a curved mirror, is arranged between the optical correction plate and the field surface closest to the optical correction plate. There may be more than one optical element in the interspace between the optical correction plate and the next field surface, for example 2, 3, 4, 5 or more optical elements. The optical correction plate may be arranged between optical elements of the projection objective.

In some embodiments a correction plate may be positioned at or close to a pupil surface of the projection objective. For example, a pupil space may be defined around a pupil of the projection objective in a region where an absolute value of the paraxial sub-aperture ratio SAR is in a range $0.8 \leq |SAR| \leq 1$, and wherein the optical correction plate is arranged in the pupil space.

The optical correction plate may be arranged at a pupil surface of the projection objective such that the first and the second optical surface are arranged at positions characterized by opposite signs of a paraxial aperture ratio.

The optical correction plate may be placed outside from and at a distance to a pupil surface. In some embodiments the correction plate may be arranged in a region of divergent beam or convergent beam such that the absolute value of the paraxial sub-aperture ration SAR differs significantly between the first and second optical surface of the correction plate.

In some cases it may be desirable to induce not only a dominant field aberration, but also a specific pupil aberration utilizing one and the same optical correction plate. Due to the fact that the structure of the correction plate allows inducing a dominant field aberration without necessarily introducing a pupil aberration, it is also possible to influence a pupil aberration in a targeted manner by slightly modifying the structure of the correction plate configured to induce a dominant field aberration alone. In general, the generation of the desired pupil aberration may be generated by slightly modifying the aspheric shapes of the first and second optical surface. The additional aspherization utilized to induce, independently of the field aberration, a pupil aberration may be treated as a second aspheric shape superimposed upon the first aspheric shape configured to induce the dominant field aberration.

Considerations of the inventors and aspects of the disclosure which may contribute to solving prior art problems are now discussed in detail.

In contrast to the influence of the force of gravity on the optical elements—lenses, mirrors or diffractive elements—belonging to the projection objective, a sagging of the reticle induces only a very slight pupil error and, overwhelmingly, a variation in the distortion terms of the pupil. For treating these technical problems the following should be understood in the context of this application:

The following is illustrated/defined with the aid of a rotationally symmetrical projection objective as an example. However, this does not in any way signify that this application is restricted to rotationally symmetrical projection objectives.

For any desired, but permanently selected numerical aperture and any desired but permanently selected object field point q of an arbitrary but permanently selected object field Q, the maximum radiation bundle belonging to this object field point, and the thereby defined wavefront w in the pupil can be determined, that is to say can be calculated or measured, such as interferometrically. If this pupil is trans-formed onto the unit circle, the deviation of the real wavefront from a spherical wave can be expanded in normalized Zernike polynomials $Z(p)$. The variable p of this expansion then corresponds to the location of a radiation ray in the pupil P, and this expansion has q from Q as parameter. Compare, e.g. US 2003/0071986 A1, which is hereby incorporated into its entirety in this text ba reference. This expansion fully describes for a fixed object field point q from Q the pupil error of the real projection objective for this field point.

If the projection objective is rotationally symmetrical with reference to its optical axis, it is also possible to proceed as follows:

For any desired, but permanently selected point p of the pupil P of a rotationally symmetrical projection objective, the field point q from Q can be allowed to vary. If Q is now also normalized onto the unit circle, this variation of q from Q can likewise be expanded in the normalized Zernike polynomials. In this case, q from P is the desired but permanent parameter.

Consequently, a representation of the aberrations (i.e. imaging errors) of the projection objective is arrived at, that is to say a representation of its deviation from an ideal optics of prescribed aperture and field size. The representation of the aberrations of the projection objective in the tensor product space $P \otimes Q$ is:

$$w(p, q) \approx \sum_{i=1}^{n} \sum_{j=1}^{m} \alpha_{i,j} Z_i(p) Z_j(q), \, p \in P, q \in Q.$$

Depending on how many coefficients $\alpha_{ij}$ are determined for the two expansions, the errors of the projection objective are more or less fully described:

For example, the Zernike expansion with n=36, 49 or 100 and m=36, 49 or 100 coefficients can be determined.

In the context of this application, the pupil error $w_P$ is intended to be understood as the field-independent, that is to say field-constant component of the above expansion:

$$w_P(p, z) \approx \sum_{i=1}^{n} \alpha_{i0} Z_i(p) Z_0(q) = \sum_{i=1}^{n} \alpha_{i0} Z_i(p), \, p \in P, q \in Q$$

The field error $w_q$ is therefore to be understood as $w_q = w - w_P$.

Such a description is of particular use whenever elements and/or changes in the projection objective that deviate from the generally rotationally symmetrical design of the projection objective are to be described. If, for example, an optical element of the projection objective experiences a change, the expansion of the projection objective can be determined with the aid of this change, and the expansion without this change can be subtracted therefrom. The difference thus arising relative to the design serves as a description of the optical effect of the change on the imaging properties of the projection objective, and/or it characterizes the element via its optical effect.

In the context of this application, this difference is to be denoted as the effect induced by this change in the projection optics or by a selected optical element of the projection optics.

Such changes can be changes in position, deformations and aspherizations of optical elements, for example. In particular, aspherizations may be regarded as changing of an optically effective surface of one of the optical elements belonging to the projection objective. If such an element is provided for exchange, its induced effect is, however, understood not as a difference from a missing element, but as a difference from a canonically prescribed element corresponding to the design of the projection objective. For example, an exchangeable, aspherized plane plate induces an optical effect relative to a projection objective provided with a non-aspherized plane plate, and not to a projection objective entirely without such a plane plate.

If, for example, a mirror that is located in a pupil plane of the projection objective is azimuthally deformed in two waves by its mounting, the effect induced by this deformation, and thus the above difference, are substantially dominated by the coefficients $\alpha_{50}$ and $\alpha_{60}$ $$w(p,q) \approx \alpha_{50} Z_5(p) + \alpha_{60} Z_6(p), p \in P, q \in Q$$

An azimuthal deformation in two waves of a mirror lying in a pupil plane of the projection objective therefore induces an approximately pure pupil error.

In the context of this application, according to one possible definition, the dominance of a set of coefficients $$\{\alpha_{ij}; i \in N, j \in m\}, N \subseteq \{1, \ldots, n\}, M \subseteq \{1, \ldots m\}$$

or a partial sum $$\Sigma_{i \in N, j \in M} \alpha_{ij} Z_i(p) Z_j(q)$$

of the expansion $$w(p, q) \approx \sum_{i=1}^{n}\sum_{j=1}^{m} \alpha_{i,j} Z_i(p) Z_j(q), \; p \in P, q \in Q$$

of the errors of projection objective is to be understood to mean that each coefficient belonging to this set is greater magnitude wise by at least 200% than the coefficients not belonging to this set. If this holds with 400% or even 900%, strong or respectively total dominance is to be spoken of in the context of this application.

The expansion used here is only one of a plurality of ways to describe expansion in an orthonormal system The dominance may also be defined in a similar way in other orthonormal systems.

In the case of an azimuthal distortion in two waves of a mirror lying in a pupil plane of the projection objective, there is thus a dominant or even strongly or totally dominant, set $[\alpha_{50},\alpha_{60}]$ of coefficients or, formulated otherwise, a dominant or even strongly or totally dominant, field-independent astigmatism present. If this mirror azimuthally deformed in two waves is located nearer the field or image field of the projection objective, the coefficients are relevant to further coefficients $\alpha_{ij}$, and $[\alpha_{50},\alpha_{60}]$ is no longer dominant:

$$w(p, q) \approx \sum_{i=1}^{n} \alpha_{i0} Z_i(p) \quad \text{I}$$

$$+ \sum_{j=1}^{m} (\alpha_{2j} Z_2(p) + \alpha_{3j} Z_3(p)) Z_j(q) \quad \text{II}$$

$$+ \sum_{i=4}^{n}\sum_{j=1}^{m} \alpha_{ij} Z_i(p) Z_j(q), \, , \quad \text{III}$$

$$p \in P, q \in Q$$

This therefore yields three summands I, II and III: summand I describes the pure pupil error. Summand II are the coefficients of field-variable distortion in the pupil, and therefore spatial displacements of the wavefront. The terms from summand II are precisely those that describe the effect induced by sagging of the reticle. Summand III describes residual aberrations.

In order to compensate the sagging of a reticle, it would now be desirable to reduce the coefficients of the summands I and III such that the coefficients from summand II become dominant. In some instances, the coefficients from summand II become strongly dominant. In certain instances, the coefficients for summand II become totally dominant.

However, no matter how a deformable mirror, for example, is situated in the projection objective, and no matter how it is deformed, the coefficients from summand II will never become dominant, since a deformation of a mirror induces ever higher terms from summands III and will never be free from a pupil error (summand I).

The problem thus arises of providing a projection objective for microlithography that includes an optical element and/or provides the possibility of manipulation that induces a dominant effect from summand II.

In another formulation of the problem, this optical element is designed and arranged to induce a dominant field error. The aim is thus to induce an effect in the case of which the coefficients from summands II and III are dominant.

In a yet another formulation of the problem, the intention is that this optical element be able to correct and/or adjust for a pure pupil error independent thereof; that is to say be able to induce the dominant effect of summand II or of the sum of summands II and III and, independently thereof, the dominant effect of summand I.

The above "independence" of the pupil error is understood to be that the optical element enjoys two degrees of freedom: a first one inducing the field error and a second one inducing the pupil error. In the same manner the dominance of each degree of freedom has to be understood separately. As a matter of fact an optical element being able to induce a first and a second dominant effect independently, say having sets of coefficients M1,N1, and N2,M2, respectively, is more flexible than an optical element being able to induce a dominant effect having the sets of coefficients M1∪M2,N2∪M2.

According to another formulation of the disclosure, a projection objective for microlithography is presented that includes an optical element with an optically active first surface and an optically active second surface, both of which are aspherized with reference to the optical axis without rotational symmetry, such that the aspheres jointly induce a dominant field error.

The dominant field error can be a field-variable distortion,

In some embodiments, the dominance is strong or even total.

In certain embodiments, the first or the second optical surface contains an additional aspherization that induces a dominant pupil error on its own and independently of the field error. This dominance can likewise be strong or total.

In some embodiments, this optical element is a plane plate aspherized on both sides and having similar aspheres, and the optically active surface (i.e. the optical surface) is the front side or rear side of the plane plate.

Generally speaking, aspheres are quantified as a deviation from a fundamental reference sphere and, normalized to the radius 1, are specified as a function f on the unit circle. Generally, expansion in Zernike polynomials is also specified in a fashion comparable to the wavefronts above. In the scope of one aspect of this application, two aspheres f, g are to be denoted as similar if two parameters $\alpha \neq 0$, $\beta > 0$ exist such that $$f(x) = \alpha g(\beta x), |x| \leq 1$$

holds.

In some instances, $\alpha$ is near 1, and $\beta$ likewise is near 1 or near 0.95, or near 0.9 or near 0.8.

In some embodiments these aspheres azimuthally have a two-wave or three-wave or four-wave or multi-wave shape azimuthally In certain instances, the first and second optical surface have a peak-to-valley (PV) value of at least 0.3 micrometers (e.g., at least 1.0 micrometer, 3.0 micrometers or more).

In certain embodiments, the projection objective for microlithography is distinguished in that the location of a first radiation bundle differs from the location of a second radiation bundle on the first or on the second surface, and in that these two radiation bundles diverge on this surface.

In some embodiments, the projection objective for microlithography is distinguished in that the diameter of the first radiation bundle on the optically active surface to which the radiation bundle can be applied corresponds to an absolute value of the paraxial sub-aperture ratio from an interval of [0.8;0.95] or [0.9;0.95]. These positions correspond to positions close to, but at a distance from a pupil surface.

In certain embodiments, the projection objective for microlithography is distinguished in that the angle of a first radiation bundle differs from that of a second radiation bundle on the first or the second surface.

In some embodiments, the diameter of the first radiation bundle on the first surface or on the second surface corresponds to an absolute value of the paraxial sub-aperture ratio from an interval of [0.8;1.0] or [0.9;1.0] or [0.95;1.0]. These positions correspond to positions very close to or at a pupil surface, i.e. positions in a pupil space.

In certain embodiments, the paraxial sub-aperture ratios on the first optical surface differ from those on the second optical surface.

These embodiments of the disclosure can also be combined.

The optical element or further optical element of the projection objective can be designed such that it can be displaced, rotated, deformed, exchanged, cooled or heated, and can be equipped with an associated manipulator system.

According to another aspect of the disclosure, a projection exposure apparatus or machine for microlithography is provided that includes one of the projection objectives specified above.

According to another aspect of the disclosure, methods for operating a projection exposure machine for microlithography are specified, utilizing such projection objective and/or optical correction plate. Such methods may be utilized to fabricate semiconductor devices and other types of microdevices.

According to another aspect of the disclosure, an exchangeable element designed as an optical correction plate for a projection objective for microlithography is specified, which may be exchanged for another optical correction plate or for a plane parallel plate of a projection objective.

The previous and other properties can be seen not only in the claims but also in the description and the drawings, wherein individual characteristics may be used either alone or in sub-combinations as embodiments and in other areas and may individually represent advantageous and patentable embodiments.

DETAILED DESCRIPTION

Figure 1A:
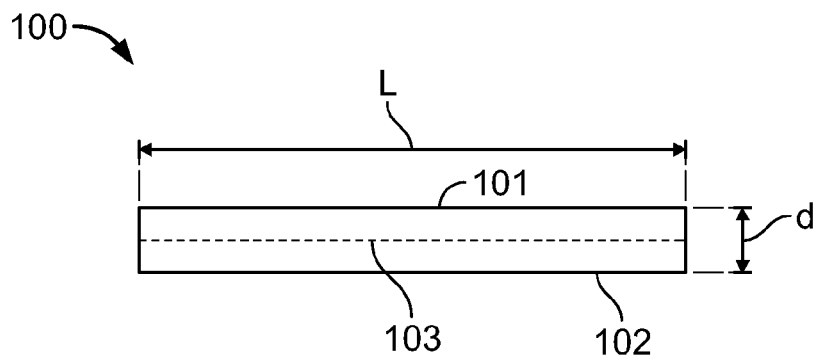
FIG. 1 shows in 1A and 1B illustrates schematically a deformation of a reticle in one dimension.
Figure 1B:
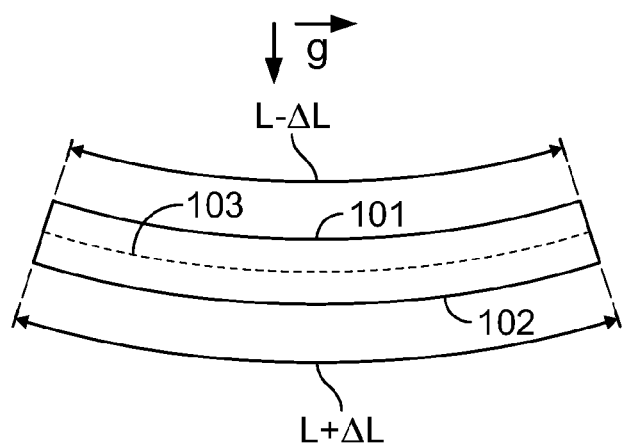

FIG. 1A illustrates a reticle 100 of edge length L and thickness d in the way it would behave without the influence of gravity. The same reticle 100 is illustrated in FIG. 1B in the way it sags under the influence of the force of gravity $\vec{g}$. The upper side 101, seen in the direction of the force of gravity, of the reticle 100 is compressed by a value $\Delta L$, while the lower side 102, seen in the direction of the force of gravity, of the reticle is stretched by a value $\Delta L$. The dashed line is the neutral fiber 103 of the reticle. This does not change in length under the influence of gravity.

Figure 2:
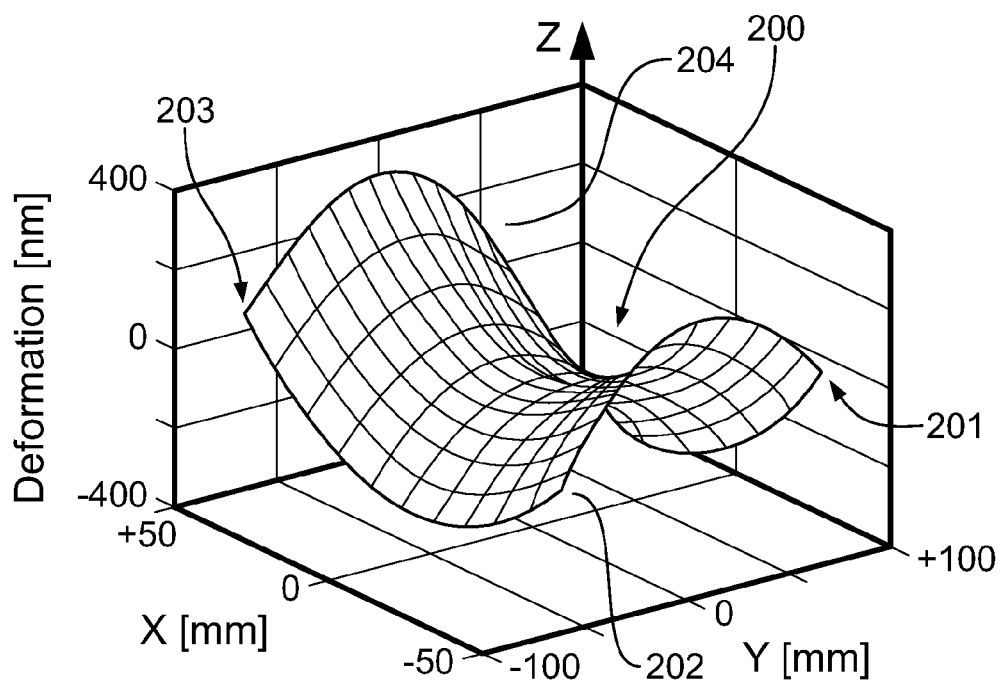
FIG. 2 illustrates schematically a saddle-shaped deformation of a reticle in two dimensions.

FIG. 2 shows a qualitative deformation of a reticle in a perspective view. If the reticle is held by the support on a frame, the deformation assumes a parabolic shape (not illustrated here) $a_1 x^2 + b_1 y^2$, $a_1, b_1 > 0$. If, by contrast, the reticle is mounted by a clamping technique, a saddle-shaped deformation $a_2 x^2 + b_2 y^2$, $a_2 > 0$, $b_2 < 0$ is superposed on the gravity-induced deformation. Such a saddle-shaped deformation is shown in FIG. 2 for a rectangular reticle 200 that is clamped at four corner points 201, 202, 203 and 204. Thus, depending on the type of reticle and on the mounting technique there will generally be a deformation of the reticle that is induced by a superposition of individual forces and/or moments, and it is described by a function f(x,y).

If it is assumed by way of approximation that the peak-to-valley value of the entire deformation varies in a range that is not greater than the depth of focus (DOF) of the projection objective, the effect induced by the deformation of the reticle on the structures, to be imaged, of the reticle is described by a spatially dependent spatial displacement of the points of the reticle that, to a first approximation, is proportional to the gradient of the deformation $\nabla f(x,y)$.

If, for example, the deformation of the reticle is dominated by being supported, as stated above, on a frame, and by a parabolic sagging induced thereby, the spatially dependent spatial displacement corresponds to a rotationally symmetrical vector field. The optical effect of such sagging is a pure scale error.

In general, the optical effect $w_r$ induced by a deformation of the reticle may be represented by the expansion $$w_r(p, q) \approx \sum_{j=1}^{m} (\alpha_{2j} Z_2(p) + \alpha_{3j} Z_3(p)) Z_j(q), \; p \in P, q \in Q$$

By way of example, a deformation of a reticle may be dominated by a saddle-shaped deformation as indicated qualitatively in FIG. 2. It can be assumed that the above expansion is $$w_r(p, q) \approx \sum_{j=1}^{m} \alpha_{2j} Z_2(p) Z_j(q) + \alpha_{3j} Z_3(p) Z_j(q), \; p \in P, q \in Q$$

Figure 3A:
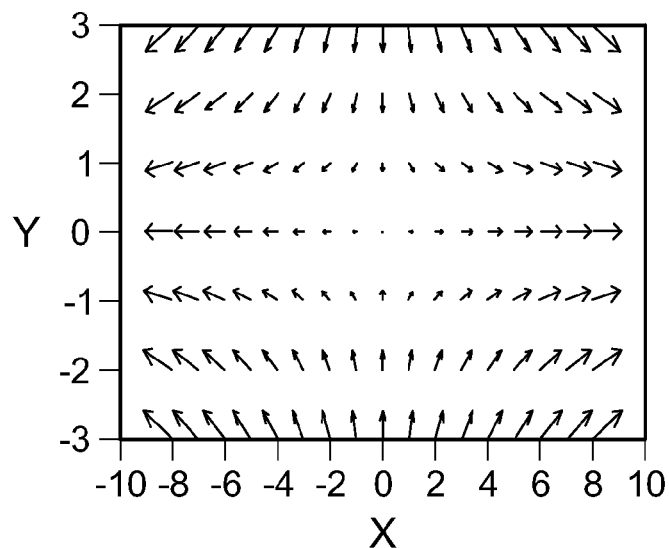
FIG. 3 shows in 3A-3C illustrates image error profiles (aberration profiles) that may be induced by a deformation of a reticle.
Figure 3A:
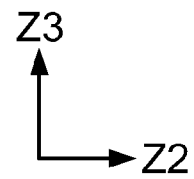

One problem that may be addressed by the disclosure will now be described in connection with FIG. 3, which shows three distortion diagrams where a spatial distribution of distortion direction and distortion amount in a rectangular field surface is represented by arrows for a plurality of field points. In the diagrams, the expected positions of field points in the absence of distortion are arranged in a two-dimensional rectangular matrix, and the arrows indicate the amount and direction of a lateral displacement of the field points due to distortion. FIG. 3A illustrates an anamorphic distortion induced by a saddle-shaped deformation of the reticle generally as shown in FIG. 2. The disturbance in the objective caused by such deformation may be described by a reduction of magnification in the y-direction (indicated by arrows pointing inwardly) and by an increase in magnification in the x-direction perpendicular thereto (indicated by arrows pointing outwardly), where the amount of displacement generally increases with a radial distance from the optical axis.

The distortions in y- and x-direction may also be described by Zernike coefficients Z3 for the distortion in y-direction and Z2 for the distortion in x-direction.

In a scanning operation with the scanning direction aligned parallel to the y-direction such distortion pattern leads to a scan integrated distortion where the displacements in the scanning direction (y-direction) will generally compensate each other to a certain degree, but may be smeared out in the y-direction. In contrast, the scanning process can not compensate for the distortion in x-direction.

Figure 3B:
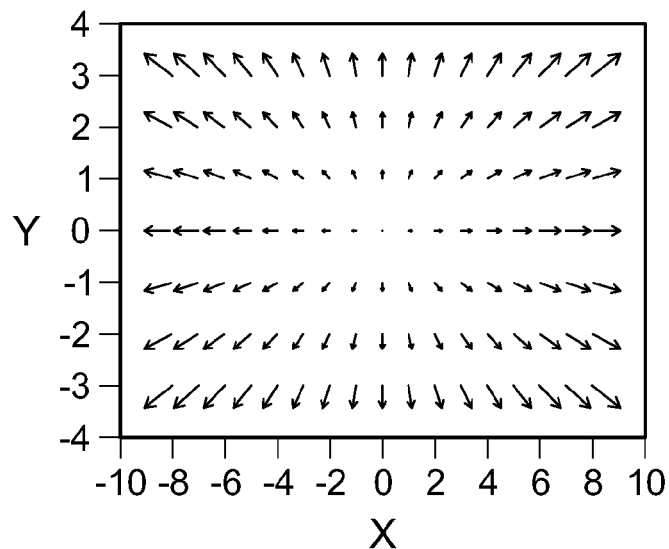

FIG. 3B shows in the same way of representation a diagram corresponding to a pure scale error (magnification error). In this case, the displacements are in the radially outward direction. As known in the art, magnification errors leading to a distortion as shown in FIG. 3B can be compensated by displacing one or more optical elements of the projection objective parallel to the optical axis (so-called Z-manipulation).

Figure 3C:
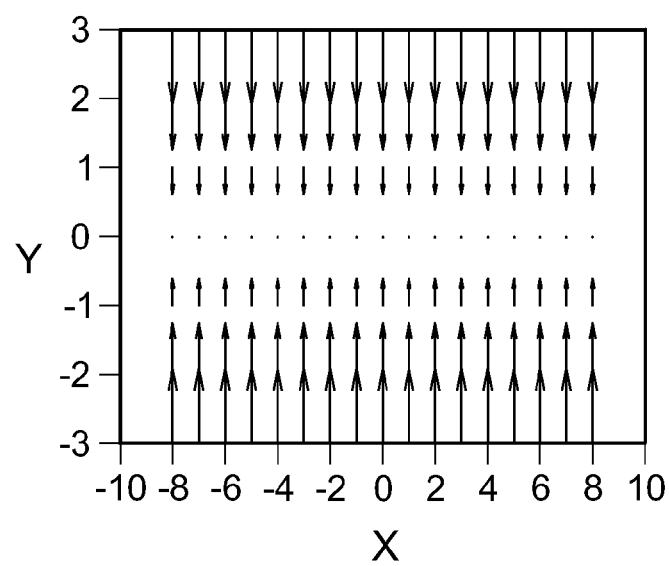

FIG. 3C shows a resulting distortion distribution for a case when an anamorphic distortion as shown in FIG. 3A is corrected by a pure Z-manipulation (change of magnification) according to FIG. 3B. The result may be described as a doubled scale error (magnification error) in the scanning direction (y-direction). In an imaging process using the projection objective having this distortion profile obtained by a correction of anamorphic distortion (FIG. 3A) by a conventional scale manipulator (according to FIG. 3B) the resulting structures in the image on a substrate are expected to be smeared out in the y-direction.

The effect generally explained in connection with FIG. 3 is known in the art as "Fading". Fading is known as measure for a field-dependent distortion of a structure. Where fading occurs, structural features will be imaged on the average at their correct expected position, but the structure will be imaged with reduced contrast. Fading occurs during a scanning operation when a structure to be imaged on a substrate appears to oscillate (i.e. move back and forth) due to the field-dependent distortion in the scanning direction (y-direction) as well as in the cross scanning direction (x-direction). The loss in contrast is the effect of such oscillation. The amount or degree of fading is typically described by a mean standard deviation (MSD-value) of the distortion, which value is calculated in different ways in the art.

For the purpose of illustration, it may be assumed that the sum, that is to say the field profile, is dominated by two-wave terms in the azimuth (i.e. in the circumferential direction. The field profile may also be described as having a 2-fold radial symmetry, as described above.

Further disclosure is now given in connection with a detailed description of several embodiments of the disclosure.

Figure 4A:
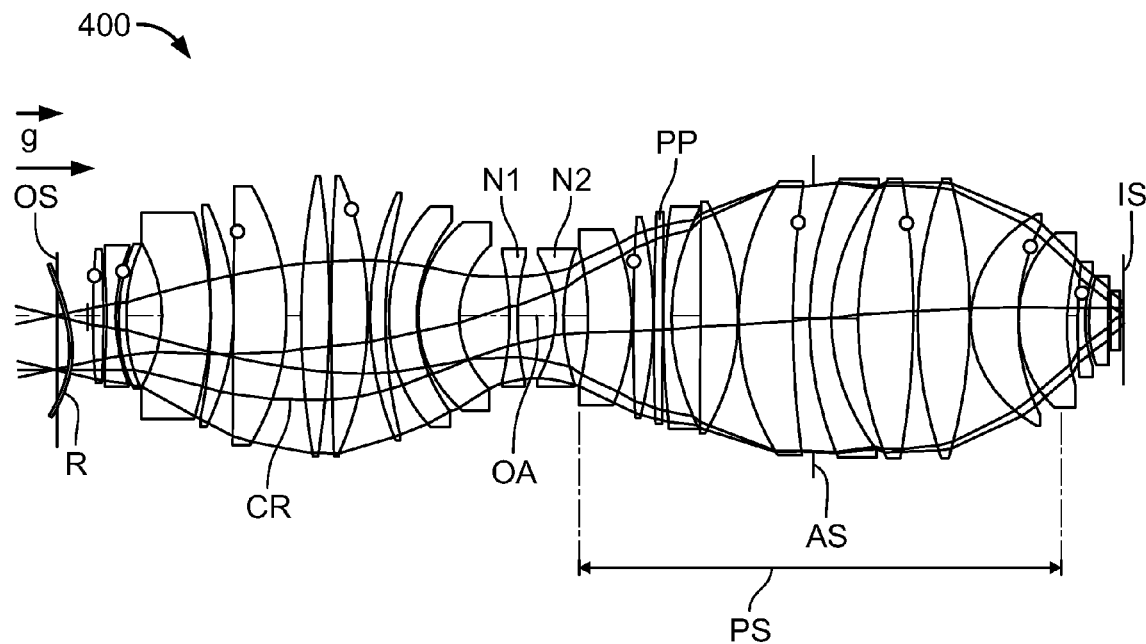
FIG. 4 shows in 4A a meridional section through a projection objective designed as a refractive projection objective, and in 4B a schematic illustration of a correction plate arranged in a region of divergent beam outside and upstream of the pupil surface of the projection objective.

A first exemplary embodiment of the disclosure is now explained in connection with FIGS. 4A and 4B, FIG. 5 and FIGS. 6A to 6F. FIG. 4A shows a purely refractive (dioptric) projection objective 600 for microlithography in a meridional section. The specific exemplary embodiment is taken from FIG. 8 of WO 2003/075096 A2 and is also disclosed in connection with FIG. 8 in U.S. Pat. No. 7,190,527 B2. The disclosure of these two documents as far as relevant for the design and specification of the projection objective is incorporated herein by reference.

Briefly, projection objective 600 is configured for $\lambda=193$ nm operating wavelength and has a maximum image-side numerical aperture NA=0.9, which can be achieved with fully opened aperture stop. The projection objective images an object field from the object surface OS into an image field in the image surface IS directly, i.e. without forming an intermediate image, at the reducing scale. The effective object field and image field are centred about the optical axis OA (on-axis field). A single waist, i.e. a single constriction of the projection beam, is formed between an object-side belly and an image-side belly of the projection objective. Two biconcave negative lenses N1, N2 are arranged in the region of the waist. The projection beam is generally divergent between the waist and the aperture stop AS situated in the image-side belly. A plane-parallel plate PP is inserted in the projection beam path about halfway between the waist and the aperture stop in the region of divergent radiation.

In operation, the projection objective is typically aligned with a vertical optical axis. The force of gravity, indicated by arrow $\vec{g}$, deforms the reticle R as illustrated with large exaggeration in FIG. 6a. The optical effect of the plane parallel plate PP having two planar surfaces parallel to each other is considered in the design process of the projection objective.

Figure 4B:
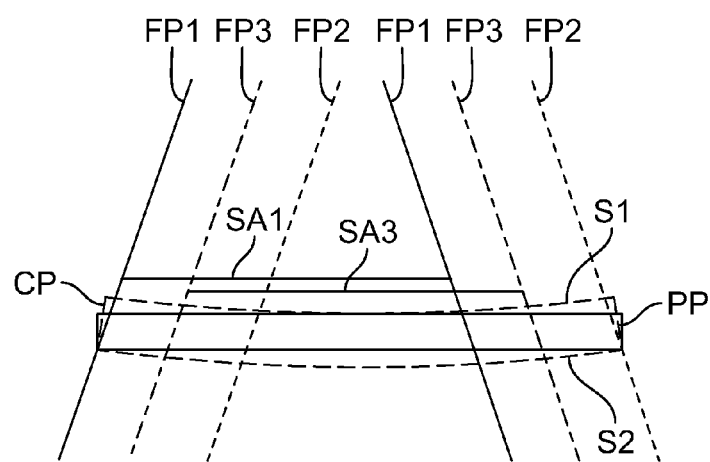

FIG. 4B shows a schematic enlarged detail of the plane parallel plate PP arranged in the divergent projection beam.

Reference identifications FP1 denote rays originating from a first field point at a first outer edge of the object field, FP2 denotes rays originating from a second field point at an opposite outer edge of the effective object field, and FP3 denotes outer rays of a ray bundle originating from an axial field point, i.e. from the field center on the optical axis OA. While the continuous lines represent the plane plate PP according to the original design discussed above, the dashed lines represent an optical correction plate CP having a first surface S1 and the second surface S2, where each of the surfaces S1, S2 has a rotationally asymmetric surface profile. First surface S1 represents the entry surface, which is the upper surface and the projection objective if oriented vertically, and surface S2 is the exit surface (or underside) of the correction element.

Figure 5:
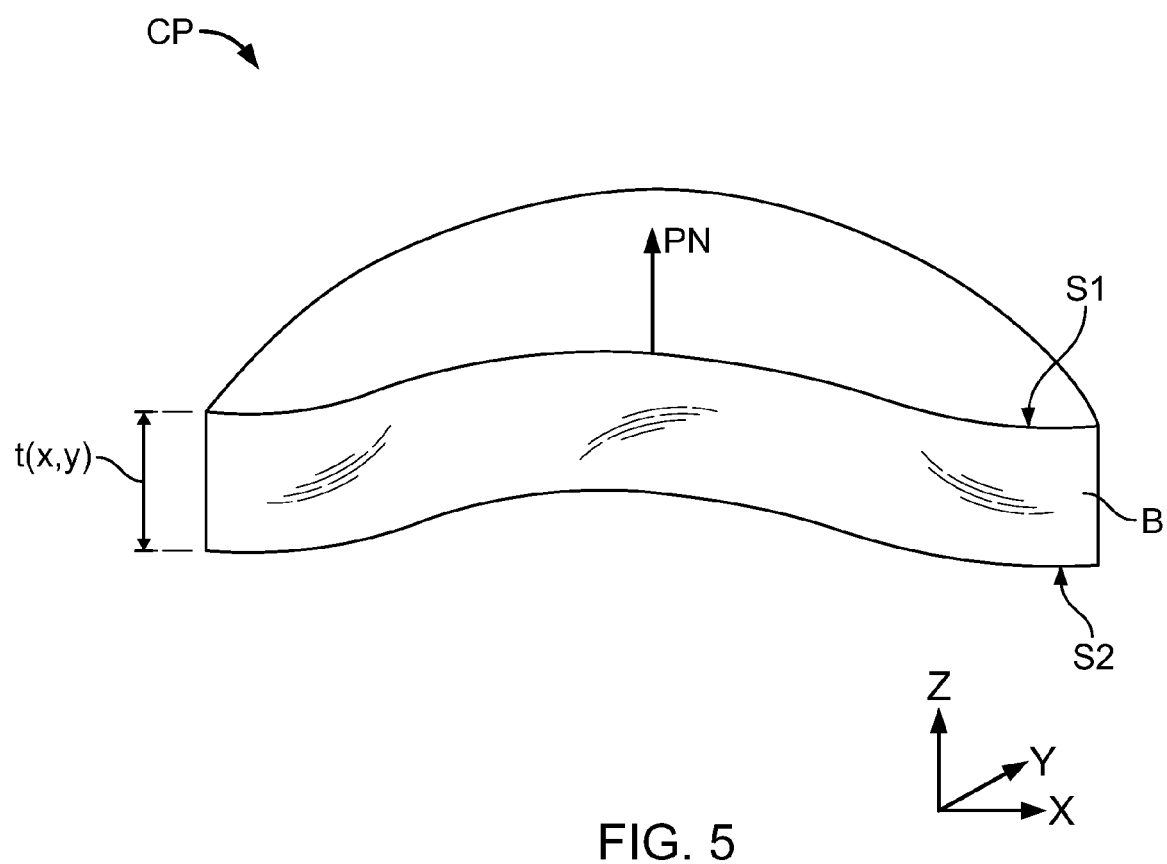
FIG. 5 shows a schematic perspective view and partial section of an optical correction plate with similar aspheric surfaces.

FIG. 5 shows a schematic view of an optical correction plate CP having a generally circular shape, which is cut along an x-direction perpendicular to a plate normal PN. When the correction plate is mounted in the projection objective, the plate normal PN is oriented substantially parallel to the optical axis OA of the projection objective. Where the aspheric profiles have a centre of radial symmetry, the centre of radial symmetry should be placed on the optical axis.

The plate has a plate-like body B made of optical material substantially transparent to the operating wavelength in the case of application. For operating wavelength in the deep ultraviolet (DUV) spectral region, such as $\lambda = 193$ nm, the body may be made of fused silica or calcium fluoride, for example. The diameter of the plate may be in the order of several centimeters, such as at least 10 cm or at least 20 cm or at least 25 cm or more or at least 30 cm or more. The body has a first surface S1 on one side and a second surface S2 on the other side, wherein each of the surfaces runs essentially perpendicular to the plate normal on a macroscopic scale. Both surfaces S1 and S2 are manufactured with optical quality and may be coated with anti-reflection (AR) coatings to reduce transmission losses. Manufacturing tolerances (differences from a desired shape) may be in the order of less than 10 nm, for example.

Both surfaces S1, S2 have a non-rotationally symmetric aspheric surface profile, i.e. a non-planar, non-spherical surface profile without rotational symmetry. The amplitude or the degree of aspherization may be characterized by respective peak-to-valley values PV representing, for each of the surfaces, the distance between a plane containing the lowest and a plane containing the highest point on the respective surface in the direction of the plate normal over the entire useful cross-section, the planes being oriented perpendicular to the plate normal PN. The peak-to-valley values PV1 for the first surface profile and PV2 for the second surface profile characterize the respective surface shapes over the entire used area in the x-y plane. The plate has a plate thickness t(x,y) which may be defined as a distance between the first and the second optical surfaces, S1, S2, respectively, measured parallel to the plate normal PN. Typically, the plate thickness varies by less than 10% of the average peak-to-valley value of both surfaces S1, S2 (i.e. (PV1+PV2)/2) across the optically used area. In other words, the variation in plate thickness is at least an order of magnitude (factor 10) smaller than the average spatial amplitude of the aspheric optical surfaces S1, S2 in terms of the respective peak-to-valley values, which qualifies some kind of global similarity between the upper and the lower surface.

In many exemplary embodiments the first peak-to-valley value PV1 and the second peak-to-valley value PV2 are greater than 5 times the operating wavelength or even greater than 10 times the operating wavelength. The peak-to-valley values PV1, PV2 may be in the order of one or two or three or more microns. Further, in many cases the plate thickness varies by less than 5% of the average peak-to-valley value (PV1+PV2)/2 and/or by less than 5% of a maximum peak-to-valley value max(PV1,PV2). Nevertheless, although the plate thickness may be substantially uniform, in most cases the thickness is non-uniform, i.e. the thickness t(x,y) varies in a defined manner across the useful cross-section. Due to the effect that the variation of plate thickness across the useful cross-section is generally very small relative to the amplitude of the aspherization, the first surface profile and the second surface profile (or the first and second optical surfaces) may be referred to as being "similar" in these cases.

In general, the thickness t(x,y) of the correction plate should be sufficient to provide that the first optical surface S1 and the second optical surface S2 are arranged at positions with a predefined difference in the paraxial sub-aperture ratio SAR with regard to magnitude and/or sign of SAR. In typical cases, the plate thickness t is at least 1 mm. The plate thickness may be 2 mm or more, or 4 mm or more, or 6 mm or more, or 10 mm or more, for example. The plate thickness may be less than 50 mm or less than 40 mm or less than 30 mm or less than 20 mm in most cases. The plate thickness may be selected such that the plate is mostly self-supporting in a mounted situation such that the entire shape of the correction plate is essentially stable against influence of gravity and other forces which may act on the plate in the mounted state.

Now with further reference to the exemplary embodiment discussed in connection with FIGS. 4A, 4B.

If the upper and the lower sides of the correction plate CP are now normalized to their diameter respectively used optically, with aspheres $\lambda_1 Z5 + \lambda_2 Z6$ and $\lambda_3 Z5 + \lambda_4 Z6$, in which case the $\lambda_i$ desirably is determined as they are indicated qualitatively by the dotted lines in FIG. 4B, and are further illustrated in FIG. 6, it is possible via a strong aspherization with a peak-to-valley value of more than 0.3 micrometers (PV>0.3 μm) and an adaptation of the aspheres of the upper and lower sides of the plate in FIG. 4B to bring the pupil error jointly induced by the aspheres to vanish approximately. To this end, the aspheres are designed to be similar in shape such that it holds for the parameters α and β that α corresponds approximately to 1, and β corresponds to the quotient of the subaperture ratios of the upper and lower sides. Here, the numerical aperture and the field size of the projection objective are selected permanently. In the projection objective of FIG. 4A, β has been set approximately as 0.9.

This aspherization now has the effect that the two aspheres jointly induce no pupil errors. On the basis of the different sub-aperture ratios of the upper and lower sides of the correction plate or, in a different formulation, on the basis of the divergent beam path in the region of the correction plate, however, a field profile of the distortion of the pupil is set that is precisely suitable for compensating the errors induced by the deformation of the reticle.

Figure 6A:
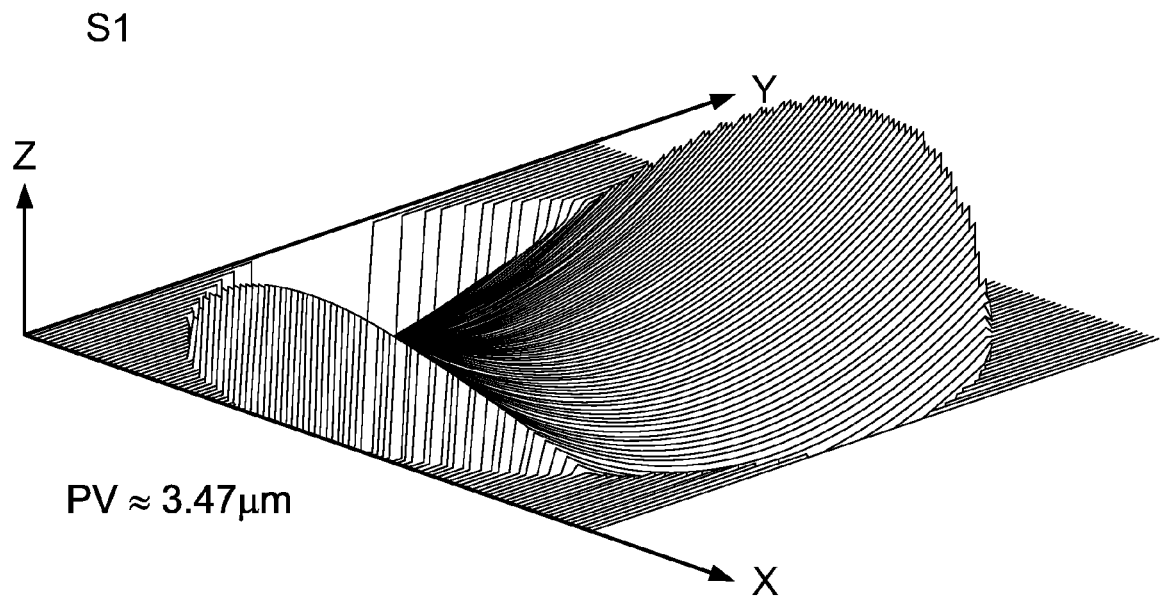
FIG. 6 shows in 6A a perspective plot of a saddle-shaped first surface S1 of a correction plate, in 6B a corresponding contour plot and schematic cuts through the saddle-shaped aspheric surface in x-direction (XCUT) and in y-direction (YCUT), in 6C and 6D a corresponding surface shape and contour plot of a saddle-shaped second surface S2, and in 6E and 6F corresponding diagrams representing the spatial variation of the plate thickness derived from the difference between the aspheric shapes of the first surface S1 and the second surface S2.
Figure 6B:
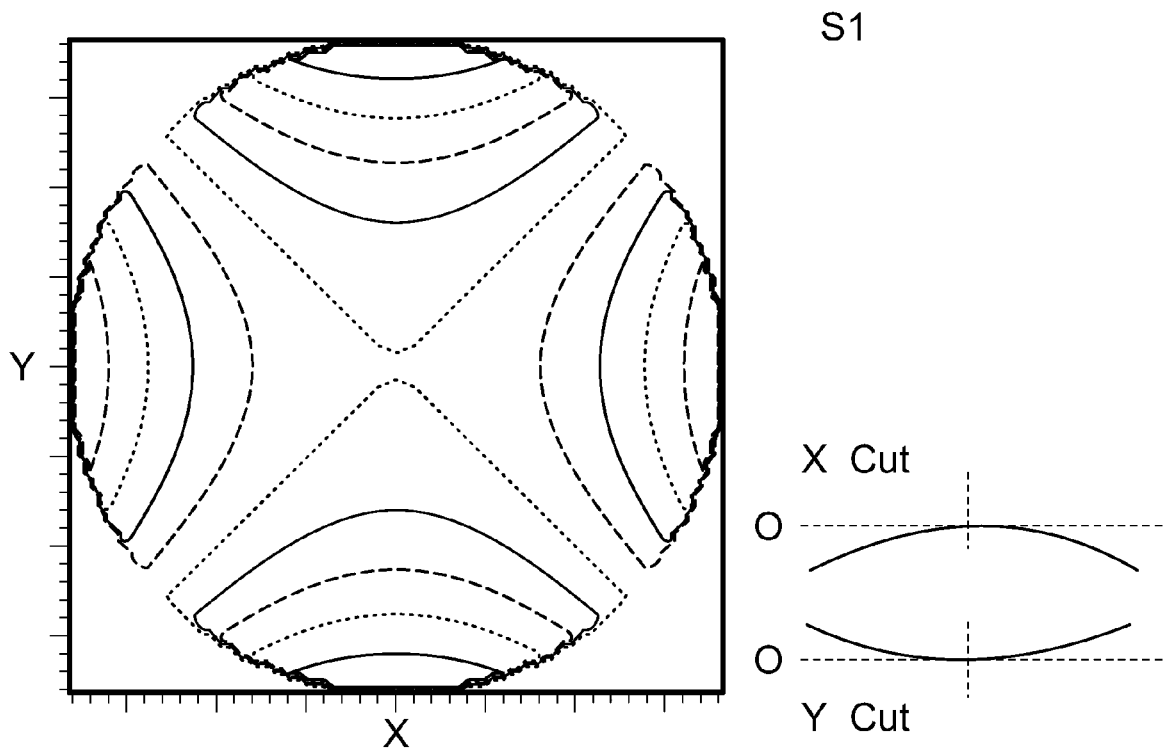

Here, the thickness of the plane plate PP provided in the design in accordance with FIG. 4A is generally somewhat larger than the value d in FIG. 6b. With other words: where the correction plate CP is manufactured in a process removing material, e.g. ion beam figuring, a plane parallel base plate belonging to the original design and from which the correction plate may be formed will have a greater thickness than the final aspherically shaped correction plate in most portions.

The situation may also be described as follows. The position of the plane plate PP which is aspherized to form a correction plate is optically near to the pupil surface P of the projection objective, which is situated at the axial position where the chief ray CR of the imaging process intersects the optical axis OA. The aperture stop AS is located at the pupil surface. A pupil space may be defined around the pupil surface, where the pupil space includes all axial positions where the absolute value of the paraxial sub-aperture ratio is equal to or larger than 0.8. The pupil space PS is indicated in FIG. 4A. The plate is positioned within the pupil space a little way outside the pupil surface upstream thereof in the region of the divergent beam. In this position, the sub-apertures belonging to different field points a laterally offset to each other, as schematically indicated for the sub-aperture SA1 of the first field point and the sub-aperture SA3 for an axial field point in FIG. 4B. Furthermore, there is a slight, but defined difference between the sub-aperture ratios of the first surface S1 and the second surface S2. Specifically, SAR=−0.877 at the first surface S1 on the object side, and SAR=−0.884 at the second surface S2 on the image side. In a different description using the ray height ratio RHR:RHR=−0.140 at the first surface S1 on the object side, and RHR=−0.131 at the second surface S2 on the image side.

Owing to a value of the paraxial sub-aperture ratio SAR<1 the ray bundles originating from laterally offset field point pass through the first and second optical surface S1, S2 in laterally offset regions. Now consider that the entry surface (first optical surface S1) has an aspheric shape generally in accordance with Zernike coefficient Z5. This aspheric surface induces in the exit pupil of the objective a corresponding Z5 aberration which is substantially constant across the entire field, i.e. a pupil aberration according to:

$$Z_5(x,y) = Z_5^0 = \text{const}$$

Due to the fact that the sub-aperture ratio is smaller than one, the field-dependent distortion, described by Zernike coefficients Z2 and Z3 for tilt in x in y direction with a specific symmetry will be induced. In the case of an aspheric shape generally in accordance with Z5 the field-variable distortion is basically an anamorphic distortion which may be described as:

$$\begin{pmatrix} Z_2 \\ Z_3 \end{pmatrix}_{anamorph} (x, y) = A \cdot \begin{pmatrix} x \\ -y \end{pmatrix}$$

The aspheric shape of the exit surface (second surface S2) is similar to the shape of the entry side surface S1 such that, in this example, the second surface profile of second surface S2 may also be described in general in accordance with Zernike coefficients Z5 in the same direction, but with slightly different amplitude (represented by a different peak-to-valley ratio PV2≠PV1). The amplitude of the surface profile of the second surface is now adapted to the amplitude of the aspheric surface on the opposite side S1 such that a field constant Z5 aberration is induced which substantially compensates the corresponding Z5 aberration caused by the entry surface S1. Due to the fact that the plate is arranged in a divergent beam and the fact that the sub-aperture ratios on the first surface and the second surface are slightly different, the contributions of the first surface S1 and the second surface S2 to the field-dependent aberration do not cancel out completely, as it is the case for the pupil aberration, but a residual amount of aberration results as a linear contribution varying across the field. The amount of this field-variable distortion can be adjusted by proportional scaling the amplitudes of the aspheric surfaces on both sides of the correction plate such that a system-specific field dependent distortion, such as caused by the asymmetric saddle-shaped deformation of the reticle, can be compensated without introducing a pupil aberration (Z5) at the same time.

Figure 6C:
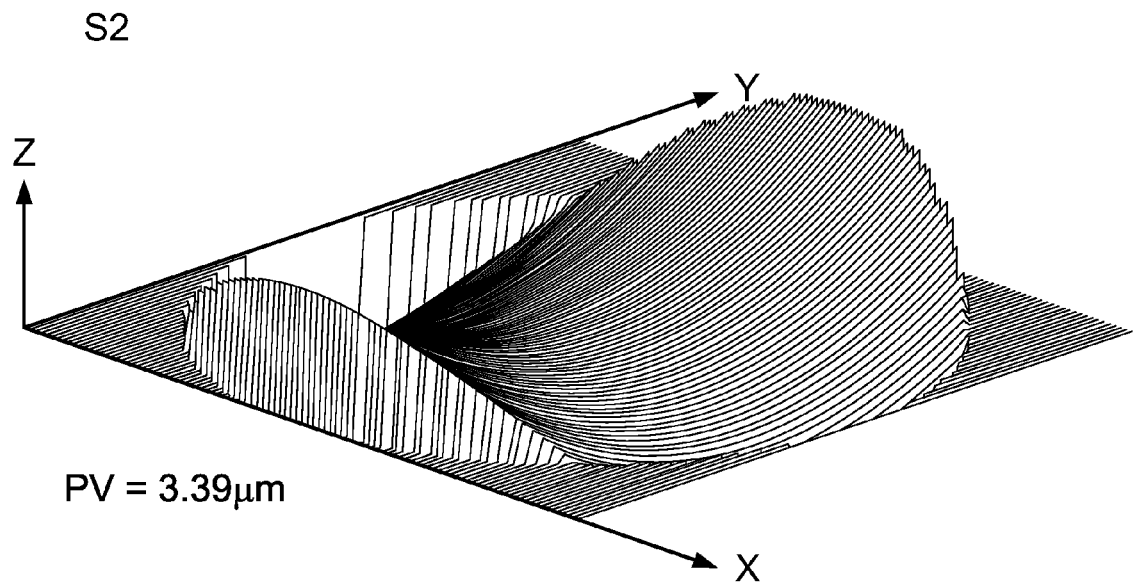
Figure 6D:
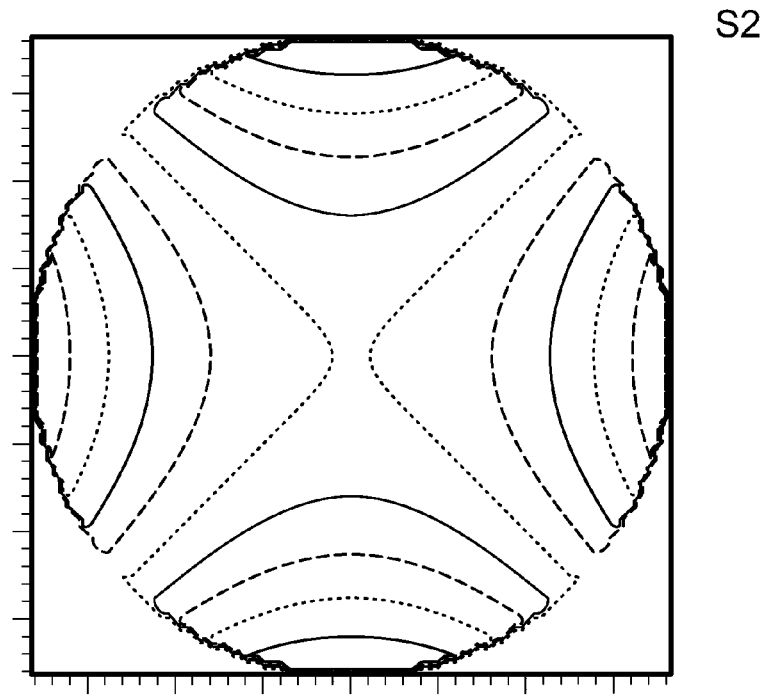

In order to illustrate the respective rotationally asymmetric surface shapes and the thickness variation of a first exemplary embodiment of a correction plate FIGS. 6A to 6F are provided. FIG. 6A shows a perspective plot of the saddle-shaped first surface S1 of the correction plate. FIG. 6B is a corresponding contour plot where the contour lines indicate lines of equal height with respect to a reference plane perpendicular to the optical axis. FIG. 6B also shows schematic cuts through a surface in the x-direction (XCUT) and in the y-direction (YCUT) at coordinates y=0 and x=0, respectively, where it can be seen that the surface has a generally convex (positive) curvature in the x-direction, whereas the continuous curvature in the y-direction has the opposite sign to form a concave shape (negative curvature). The corresponding amplitude of the asphere is characterized by PV1≈3.47 μm. FIGS. 6C and 6D show the respective representation of the second surface S2 (exit surface). The respective amplitude is slightly smaller and may be characterized by PV2=3.39 μm.

Figure 6E:
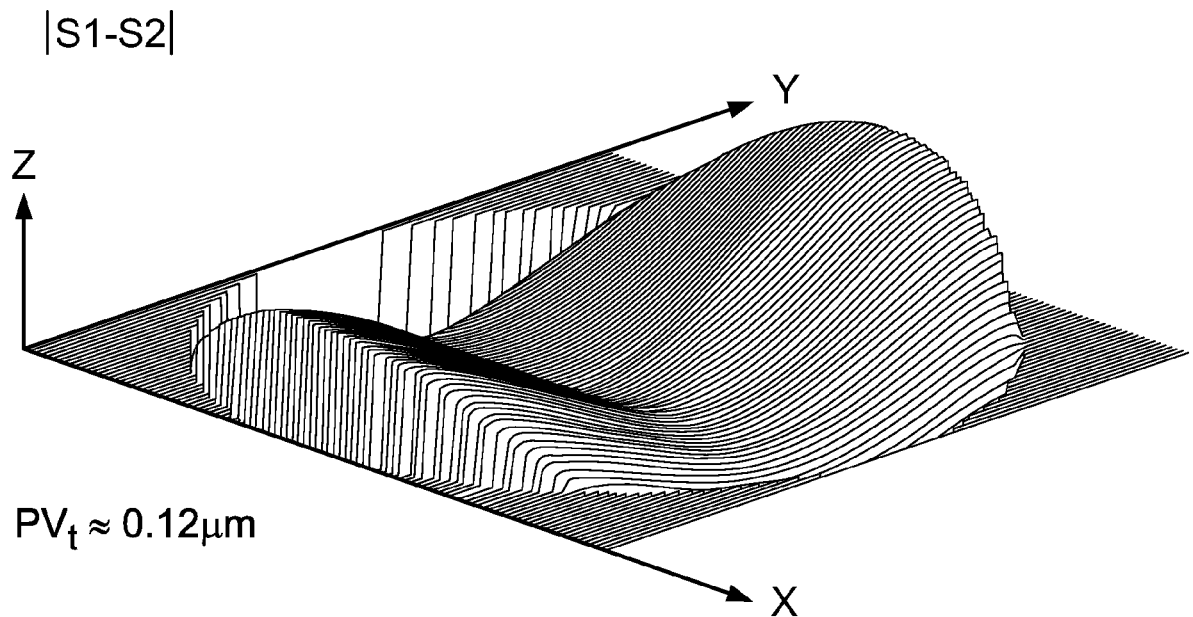
Figure 6F:
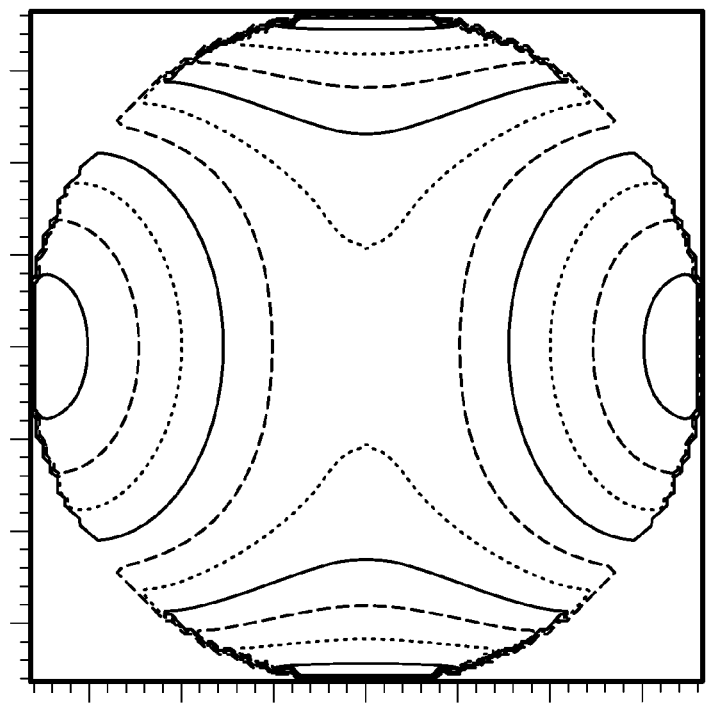

FIGS. 6E and 6F represent the corresponding variation of the plate thickness t(x,y) in two dimensions in form of a difference between the aspheric shapes of the entry surface S1 and the exit surface S2. The plate thickness variation has a substantially saddle-shaped profile with a peak-to-valley value $PV_t \approx 0.12$ μm, indicating that the variation of thickness is more than an order of magnitude smaller than the absolute height variation of the first and second surface profiles. Please note that this peak-to-valley value $PV_t$ representing the variation of thickness indicates that the plate thickness is not uniform, but varies in a predefined manner in an amount substantially larger than manufacturing tolerances of optical surfaces, which are typically in the order of nm, e.g. less than 10 nm, in many applications in the field of microlithography. The absolute amount of thickness variation is in the order of a micrometer or less, whereas the absolute thickness may typically be in the order of one or more millimeters.

Figure 7A:
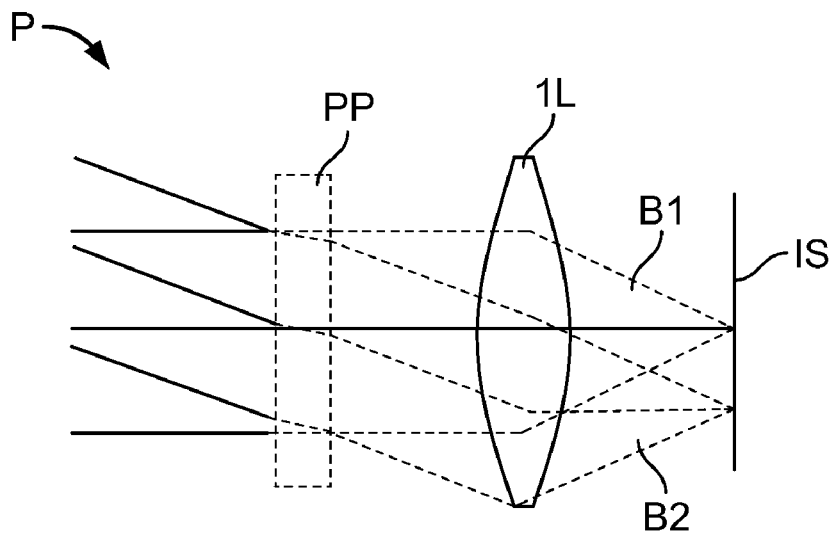
FIG. 7 shows sections through a schematic lens system having a plane plate in 7A, the same system having an optical correction plate instead of the plane plate in 7B, and in 7C a comparative view of FIG. 7A and FIG. 7B indicating a distortion aberration induced by replacing the plane plate of 7A by a correction plate of 7B.
Figure 7B:
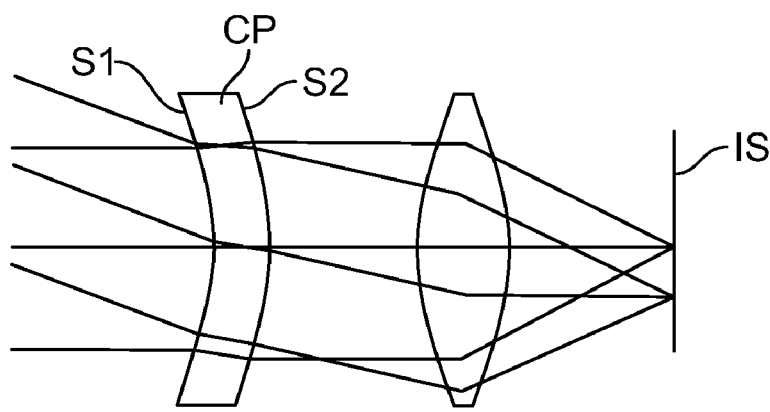
Figure 7C:
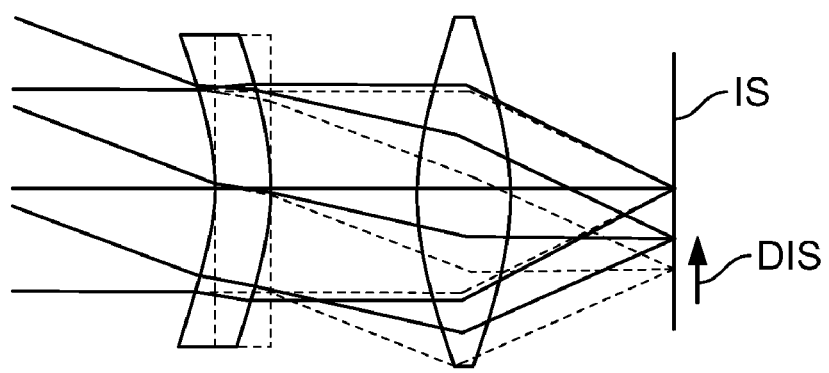

FIG. 7A to C is intended to illustrate schematically the optical effect of a correction plate CP having both surfaces with a rotationally asymmetric aspheric shape compared to a plane parallel plate PP arranged at the same position in the optical path at or close to a pupil surface P. FIG. 7A shows a reference system having plane plate PP arranged near the pupil surface of an imaging system. The figure shows the propagation of rays of two ray bundles B1, B2 from the region of the pupil P onto the image surface IS. Ray bundle B1 originates from a field point on the optical axis, ray bundle B2 originates from an outer field point at the edge of the effective object field.

With a plane parallel plate PP in the optical path (FIG. 7A) the ray angles (angles of rays with respect to the optical axis) are not changed by the parallel plate. Instead, the parallel plate only causes a parallel offset of the refracted rays downstream of the plane plate with respect to the incident rays upstream of the plane plate.

FIG. 7B shows that the situation is different if a correction plate CP having similar aspheric entry and exit surface S1, S2, respectively is inserted in the beam path instead of the plane plate PP. It is evident that the ray directions of rays of the first ray bundle B1 originating from an axial field point do not change. However, for field points outside the optical axis (ray bundle B2) the propagation of the rays changes upon transiting the correction plate due to different refracting conditions on the entry surface S1 and the exit surface S2. In particular, the ray angles vary due to the fact that tangential planes to the optical surfaces S1, S2 at the position of the ray incidence and of the exit of a refracted ray from the correction plate are no longer parallel to each other.

Therefore, the correction plate CP introduces a distortion aberration, which is indicated by an arrow DIS in FIG. 7C showing a comparative view of both situations shown in FIGS. 7A and B. The amount and direction of displacement of the image forming points varies across the field, therefore a field dependent distortion is effected. At the same time, a field-constant pupil aberration (same aberration for all filed points) may be introduced. However, the induced field pupil aberration may be reduced to zero by appropriate adaption of the aspheric shapes of entry surface S1 and exit surface S2.

Figure 8A:
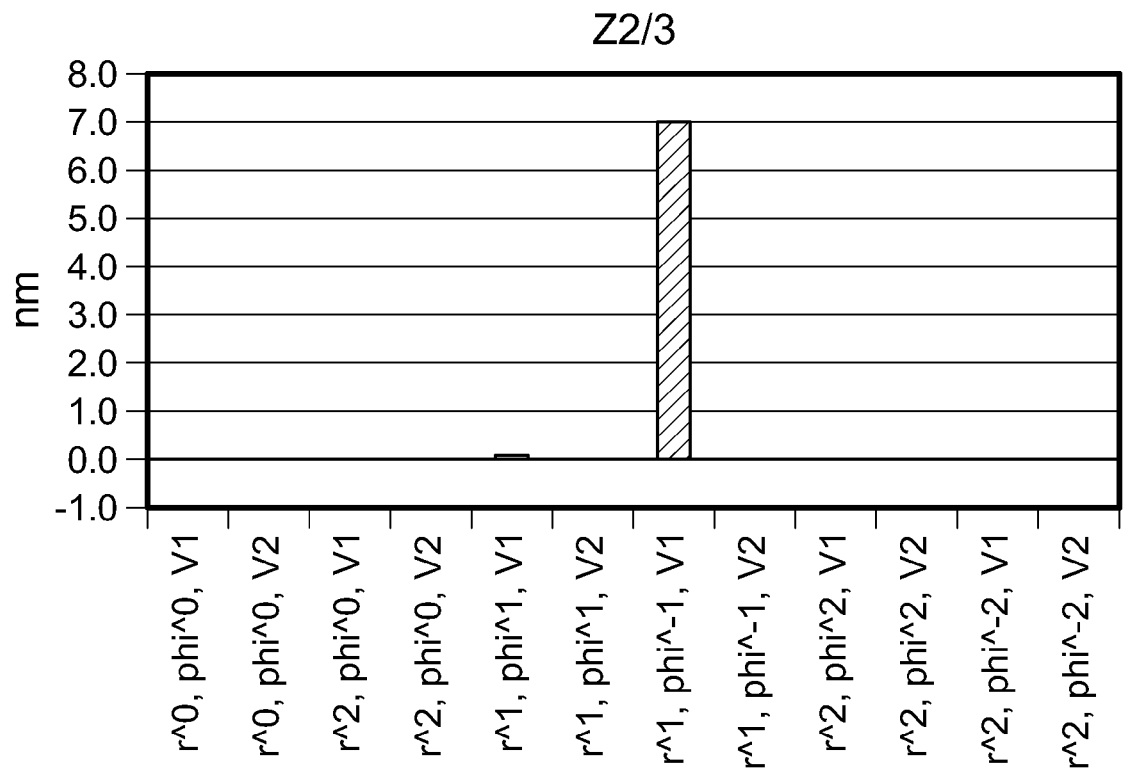
FIG. 8 shows in 8A and 8B diagrams indicating that a correction plate induces an anamorphic distortion as a dominant field aberration.
Figure 8B:
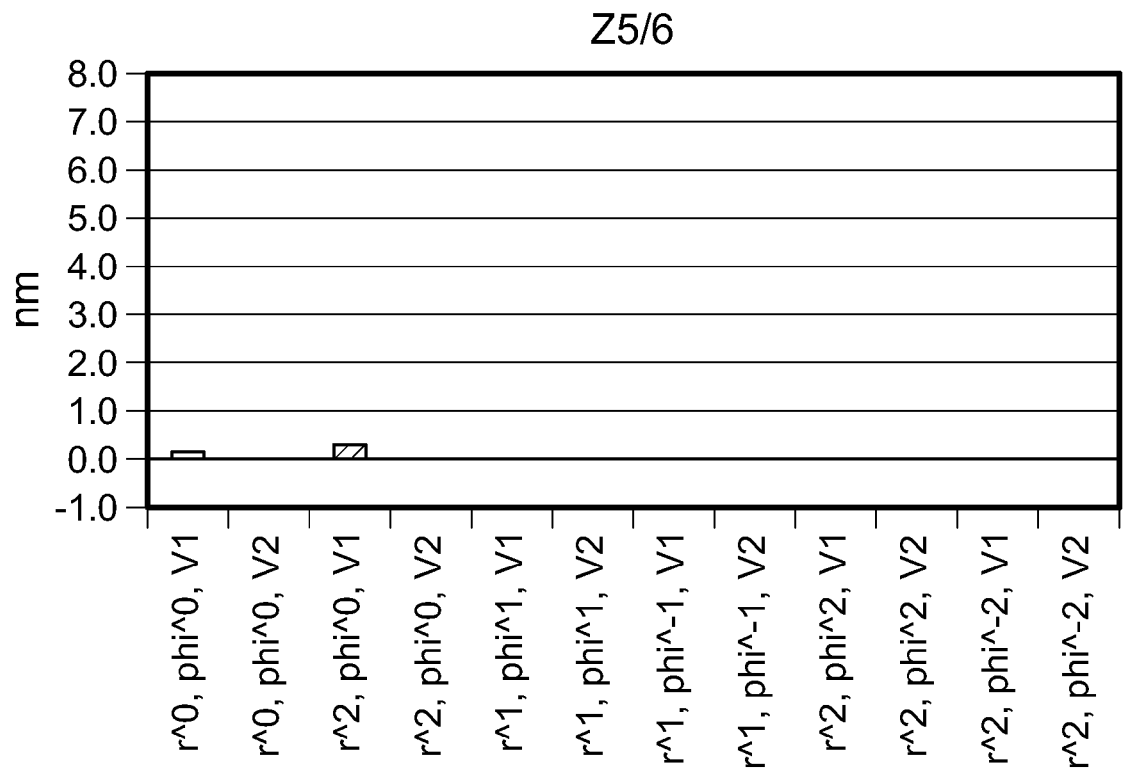

FIGS. 8A and 8B are now used to illustrate quantitatively that the correction plate according to this exemplary embodiment is able to generate one dominant field aberration, while the amount of other field aberrations may be kept at a negligible low value. For this purpose the filed profile of the aberrations generated by the correction plate in the image field has been decomposed in Zernike polynomials with radial order $r^m$ and azimuthal order $\phi^n$. As an alternative to the above scalar expansion in the tensor product space $P \otimes Q$ a vectorial representation of wave front aberrations with vector Zernikes is used. This representation is more appropriate to illustrate field dependencies of distortions:

$$V_{n,1} = \begin{pmatrix} \cos(n\varphi) \\ \sin(n\varphi) \end{pmatrix}$$

$$V_{n,2} = \begin{pmatrix} -\sin(n\varphi) \\ \cos(n\varphi) \end{pmatrix}$$

$$V_{-n,1} = \begin{pmatrix} \cos(n\varphi) \\ -\sin(n\varphi) \end{pmatrix}$$

$$V_{-n,2} = \begin{pmatrix} \sin(n\varphi) \\ \cos(n\varphi) \end{pmatrix}$$

In this representation, vector Zernike $V_{n,1}$ corresponds to a scale error with n=1, $r^1$, vector Zernike $V_{n,2}$ corresponds to a rotation for n=1 and $r^1$, and vector Zernike $V_{-n,1}$ corresponds to the anamorphic distortion. FIG. 8A shows that the contribution to anamorphic distortion (represented by V1 for Z2/3 is dominant). Specifically, a value of about 7 nm is obtained for the contribution to anamorphic distortion, while at the same time the levels of other contribution is well below 0.5 nm, i.e. less than 10% of the amount of anamorphic distortion in this representation. The contributions to Z5/6 are also negligible relative to the anamorphic distortion.

The above four vector Zernikes belong to a set of vector Zernikes representing all angle-dependent field dependencies if n>0 and all angle-independent field dependencies if n=0. Radial dependencies are described by multiplication of the above four vector Zernikes with radial polynomials of order n or greater than n, respectively. Hence there exists a second type of a complete set of so called vector Zernikes which describes the field dependency of angle dependent wavefront errors. Likewise there exists a second complete set of scalar Zernikes which describe the field dependency of angle independent wavefront errors. Those two sets in company fully describe the field dependency of any wavefront error resulting in a quantification of field dependency of wavefront errors different to the above tensor product $P \otimes Q$. In view of the fact that the field dependency describing polynomials are of dimension two and one, respectively they build no orthonormal systems in company. But since the vector and scalar Zernikes built such orthonormal systems separately the term "dominance" has to be understood with respect to the absolute coefficients related to these vector and scalar representations, respectively.

It is possible to design the amplitudes of the aspheric first and second optical surfaces such that a generated field aberration (such as the field dependent distortion) and, additionally, a desired pupil aberration may be effected with a single correction plate independently of each other. In fact, by scaling the aspherizations of the first and second optical surface appropriately any desired relation between a generated pupil aberration and a field dependent distortion may be obtained. Therefore, it is possible with one single correcting plate to perform independent of each other a correction of field-constant aberrations (pupil aberrations) and field-dependent aberrations at the same time. This may be accomplished by modifying the aspheric shapes of the first and second surface provided for the desired field-dependent correction with an additional aspherization.

Figure 9A:
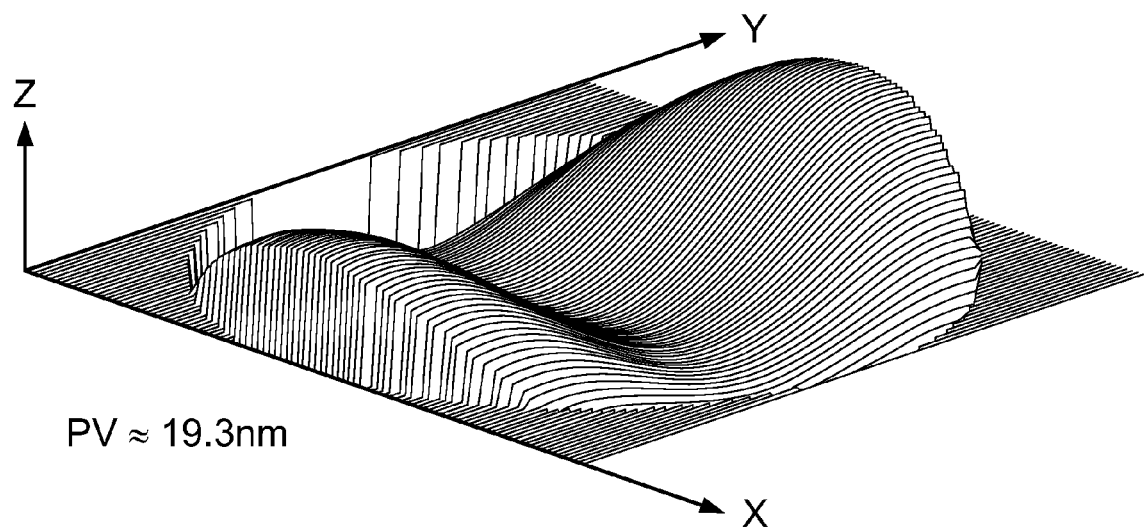
FIG. 9 shows in 9A a perspective view and in 9B a contour plot of an additional asphere superimposed over an aspheric surface of a correction plate to induce a pupil aberration in addition to a dominant field aberration.
Figure 9B:
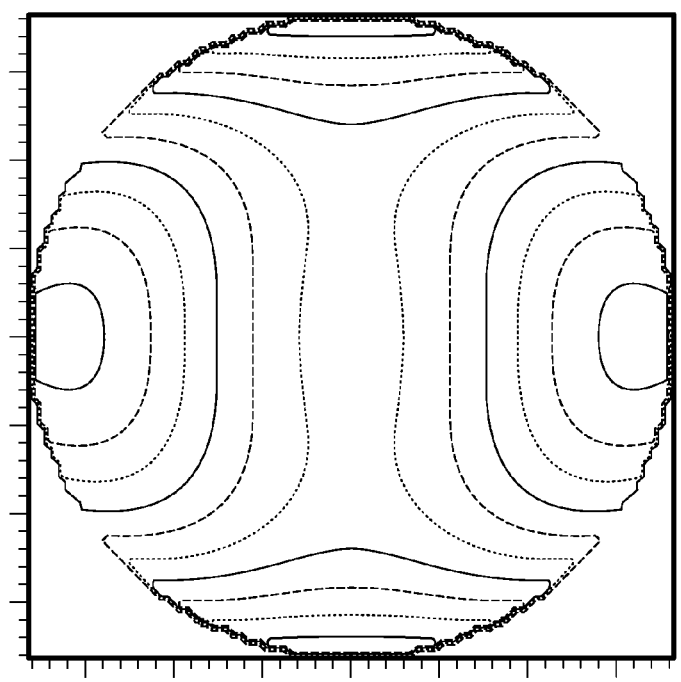

An additional aspherization to generate a predefined pupil aberration may, for example, be characterized as shown in FIGS. 9A, 9B. In this case, the additional asphere superimposed over an aspheric surface S1 or S2, or both, may be characterized by an essentially two-fold radial symmetry with a peak-to-valley value of about 19.3 nm, which is about 10% of the operating wavelength and which is several orders of magnitude smaller than the respective amplitudes (PV1, PV2) of the base aspheric surfaces provided for generating the field-dependent aberration. This option may also be described as follows:

The peak-to-valley value of this superposed aspherization is generally smaller than that of the first aspherization. It is generally no more than 0.15 micrometers in most cases.

Figure 10A:
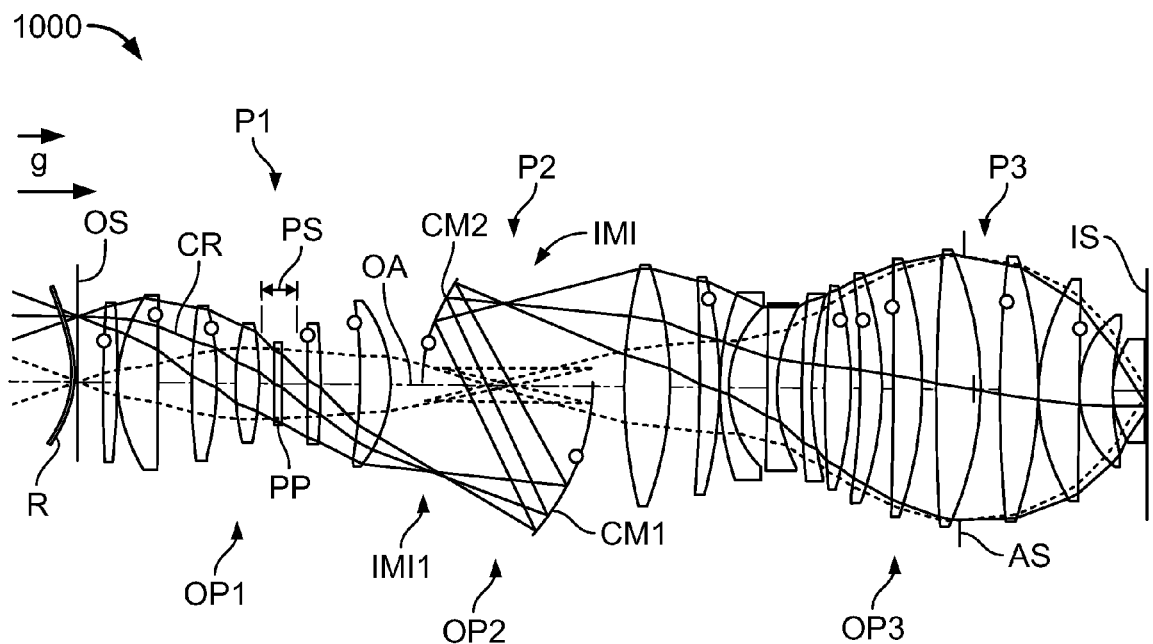
FIG. 10 shows a meridional section through of a projection objective designed as a catadioptric in-line projection objective having two concave mirrors in 10A, and in 10B a schematic view of a correction plate disposed at the first pupil surface of the projection objective of FIG. 10A.

A second exemplary embodiment is now explained in connection with a catadioptric projection objective 1000 for microlithography as shown in FIG. 10A. The exemplary embodiment corresponds to the embodiment shown in FIG. 32 of WO 2005/069055 A2 (corresponding to US 2005/0190435 A1, FIG. 32). The disclosure of these documents, particularly with respect to the overall design and the specification of the exemplary embodiment is incorporated into the present application by reference.

In general, the projection objective may be described as follows:

Catadioptric projection objective 1000 is configured for operation with λ=193 nm operation wavelength and has an image-side numerical aperture NA=0.87. The projection objective is designed to project an image of a pattern on a reticle R arranged in the planar object surface OS (object plane) into the planar image surface IS (image plane) on a reduced scale, for example, 4:1, while creating exactly two real intermediate images IMI1, IMI2. The effective object field and image field are off-axis, i.e. entirely outside the optical axis OA. A first refractive objective part OP1 is designed for imaging the pattern in the object surface into the first intermediate image IMI1 at an enlarged scale. A second, catoptric (purely reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a first concave mirror CM1 having the concave mirror surface facing the object side, and a second concave mirror CM2 having the concave mirror surface facing the image side. The used parts of the mirror surfaces are both continuous (or unbroken), i.e. the mirrors do not have a hole or bore in the illuminated region. The mirror surfaces facing each other define a catadioptric cavity, which is also denoted intermirror space, enclosed by the curved surfaces defined by the concave mirrors. The intermediate images IMI1, IMI2 are both situated inside the catadioptric cavity well apart from the mirror surfaces.

The objective 1000 is rotationally symmetric and has one straight optical axis OA common to all refractive and reflective optical components ("In-line system"). There are no folding mirrors. An even number of reflections occurs, such that there is no image flip. Object surface and image surface are parallel. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting. Both concave mirrors are positioned optically remote from a pupil surface rather close to the next intermediate image. The objective has an unobscured circular pupil centered about the optical axis thus allowing use as projection objectives for microlithography.

A plane plate PP is inserted as part of the original design at the position of the first pupil surface P1 within the first objective part OP1. There is a relatively narrow pupil space PS with $0.8 \leq |SAR| \leq 1$ around this pupil due to large chief ray angles in this region. The force of gravity is denoted by arrow $\vec{g}$, and the deformation of the reticle R is illustrated with exaggeration in FIG. 10A.

Figure 10B:
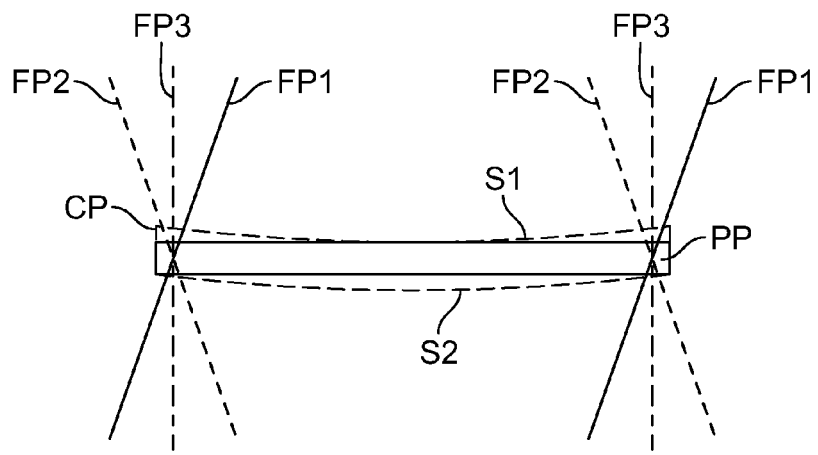

As shown in schematic FIG. 10B the plate PP is arranged exactly in the first pupil surface P1 such that the sub-aperture ratios defined by the ray bundles on both sides of the plate have opposite sign. FIG. 10B shows limiting rays from three ray bundles, where rays denoted with FP1 originate from a field point on one edge of the effective object field, rays FP2 originate from a field point on the opposite edge of the effective object field. Rays denoted FP3 originate from a virtual field point at the center of the object field. Note that this virtual field point does not belong to the off-axis effective object field actually used for imaging, but is introduced here only for illustration purposes.

Due to the fact that the correction plate is situated at a pupil surface, the subaperture ratios both on the entry side S1 and the exit side S2 are very close to 1. Specifically, SAR=+0.940 at the first surface S1 on the object side, and SAR=−0.963 at the second surface S2 on the image side. In a different description using the ray height ratio RHR:RHR=+0.064 at the first surface S1 on the object side, and RHR=−0.038 at the second surface S2 on the image side.

Further, due to the positioning at the pupil surface, the rays in each ray bundle have almost no divergence at the position of the correction plate (almost the same ray angle for all rays of the ray bundle). The fact that the rays originate from different field points in the object field transforms to the fact that the ray bundles transit the transparent plate at different angles of incidence, where the angle of incidence is generally defined as the angle between a surface normal at a point of incidence of a ray, and the propagation direction of the respective ray incident on that surface. As in the previous case, the first surface S1 (entry surface) and the second surface S2 (exit surface) may be provided with similar, but different rotationally asymmetric aspheric surface profiles in such a way that the contributions of the respective surfaces to a field constant pupil aberration compensate each other to a substantially degree so that only a residual aberration described as a field-dependent distortion remains.

Figure 11A:
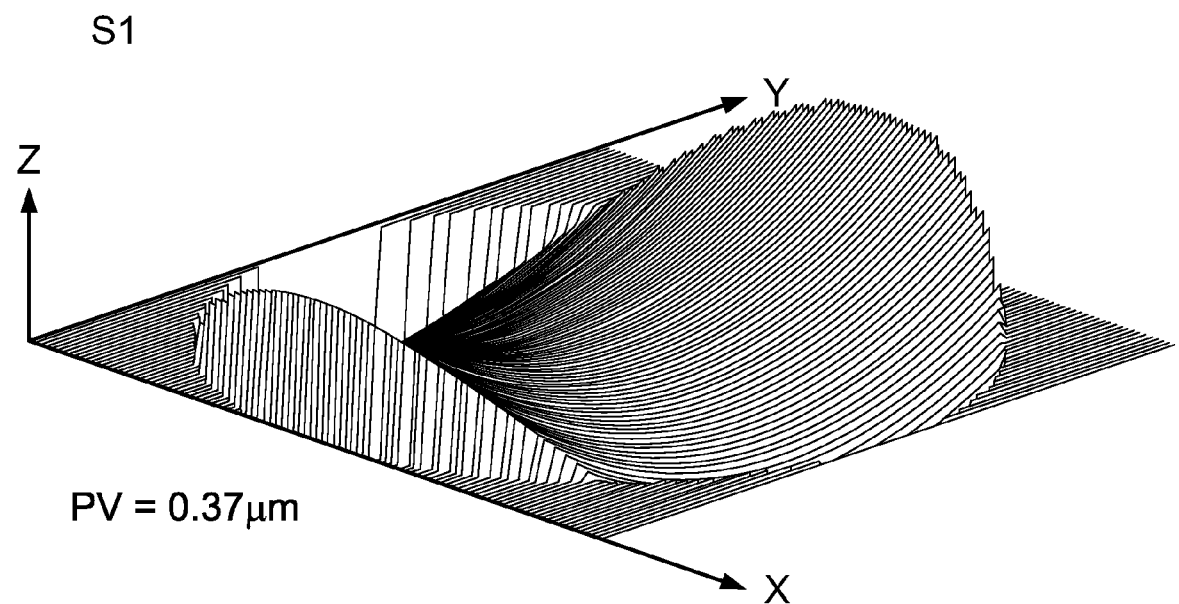
FIG. 11 shows in 11A a perspective plot of a saddle-shaped first surface S1 of a correction plate, in 11B a corresponding contour plot through the saddle-shaped aspheric surface, in 11C and 11D a corresponding surface shape and contour plot of a saddle-shaped second surface S2, and in 11E and 11F corresponding diagrams representing the spatial variation of the plate thickness derived from the difference between the aspheric shapes of the first surface S1 and the second surface S2.
Figure 11B:
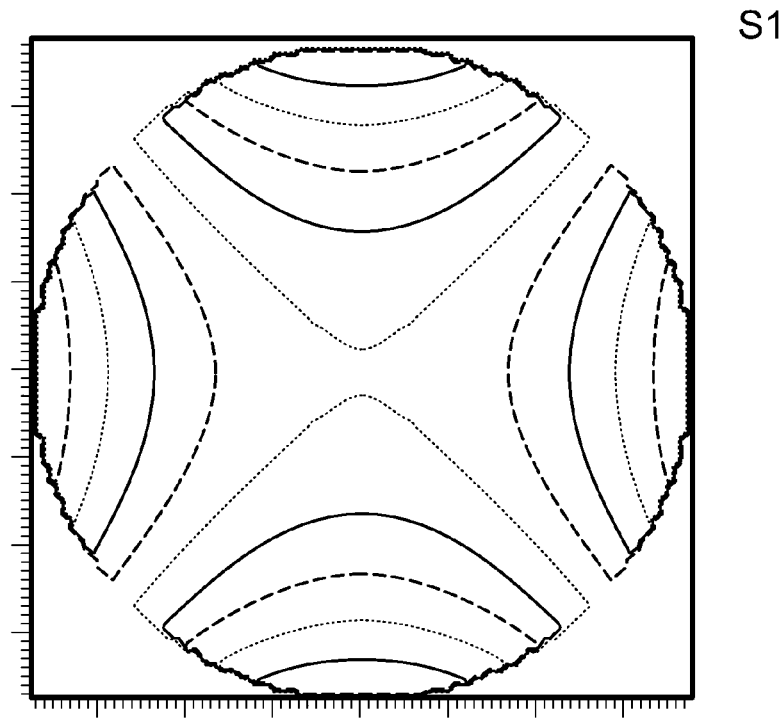
Figure 11C:
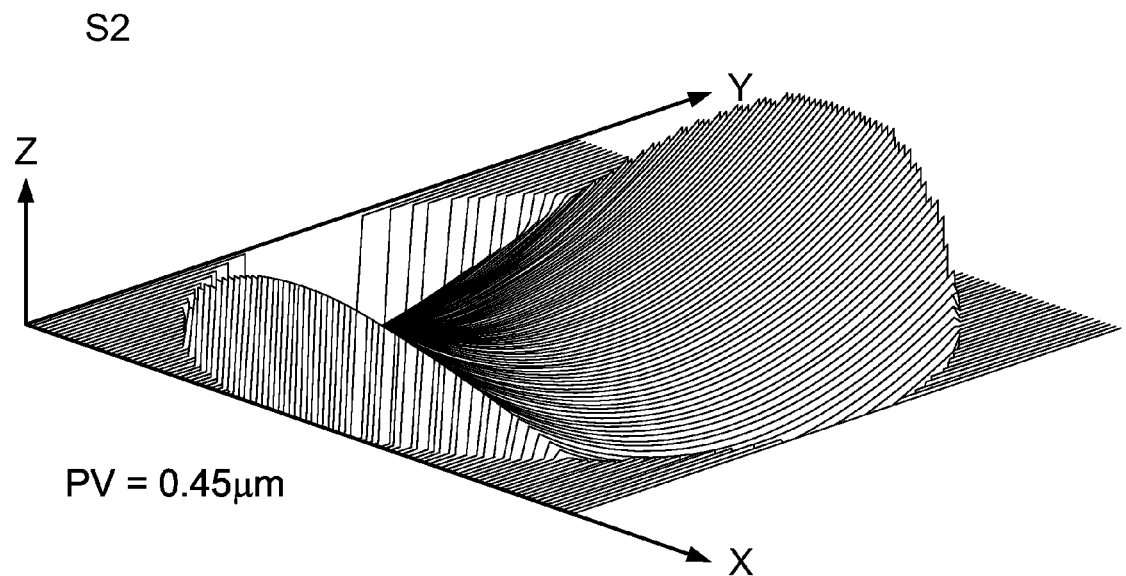
Figure 11D:
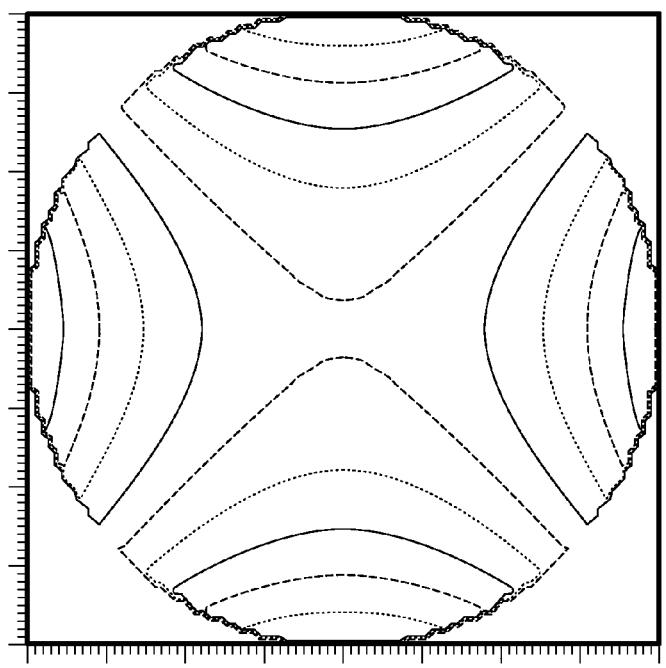
Figure 11E:
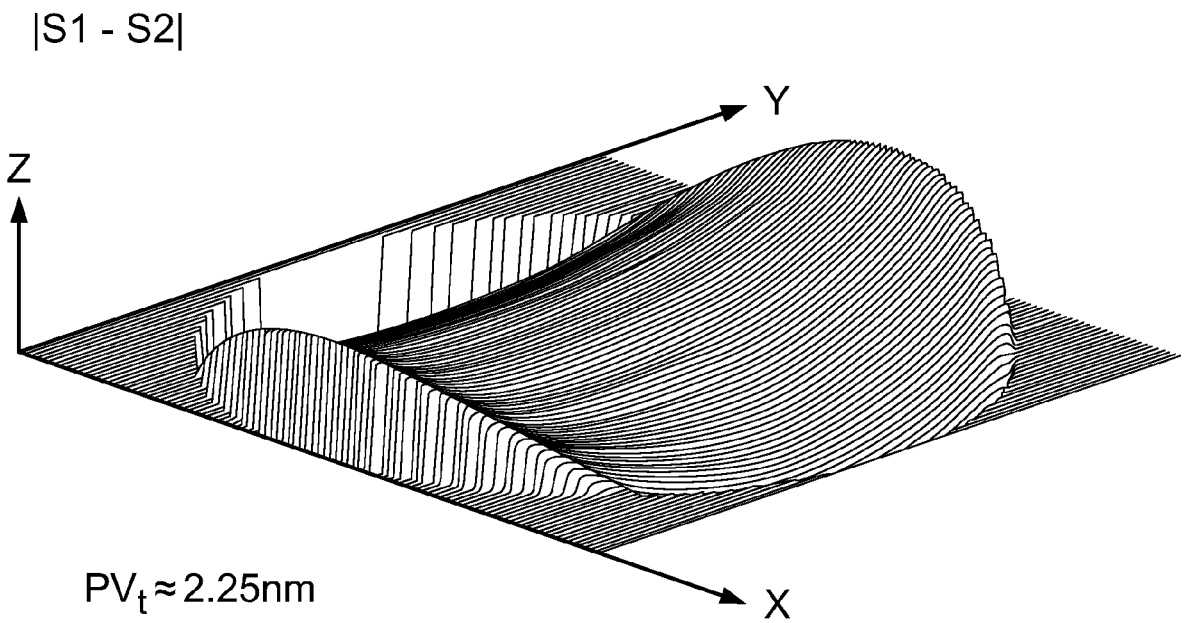
Figure 11F:
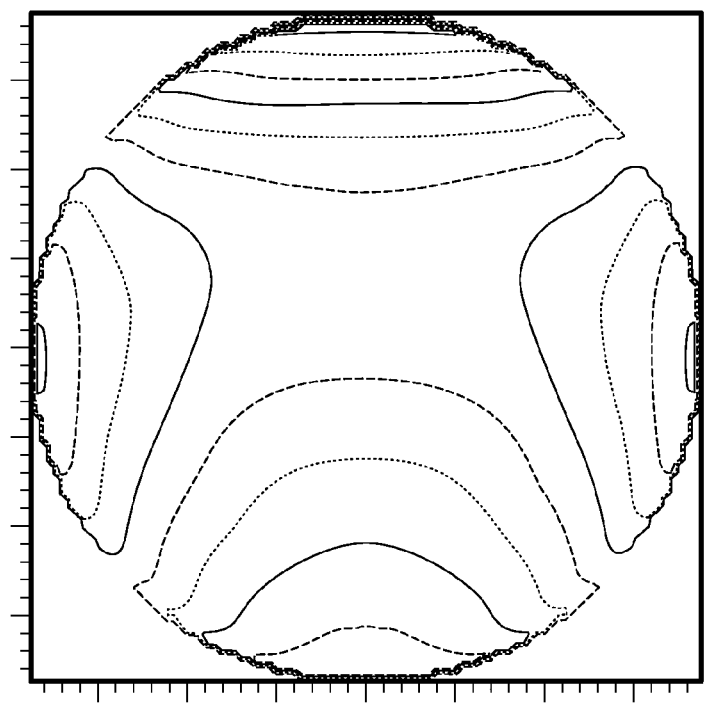

In the specific exemplary embodiment, the aspheric surface profiles of the first and second optical surfaces S1, S2 and the variation of plate thickness resulting from the fact that the aspheres are similar, but not identical, is shown in FIGS. 11A to 11F in similar manner as explained in connection with FIGS. 6A to 6F. Specifically, the amplitude of the aspheric entry surface S1 may be described by a peak-to-valley value PV1=0.37 μm, which is about twice the operating wavelength. The corresponding amplitude on the exit surface S2 may be characterized by PV2=0.45 μm. The resulting variation of plate thickness is shown in FIG. 11E, 11F and may be characterized by $PV_t \approx 22.5$ nm. As evident from FIG. 11F, the non-uniform plate thickness variation does not have radial symmetry, but a mirror symmetry with respect to a plane including the optical axis and the y-direction (scanning direction).

Figure 12A:
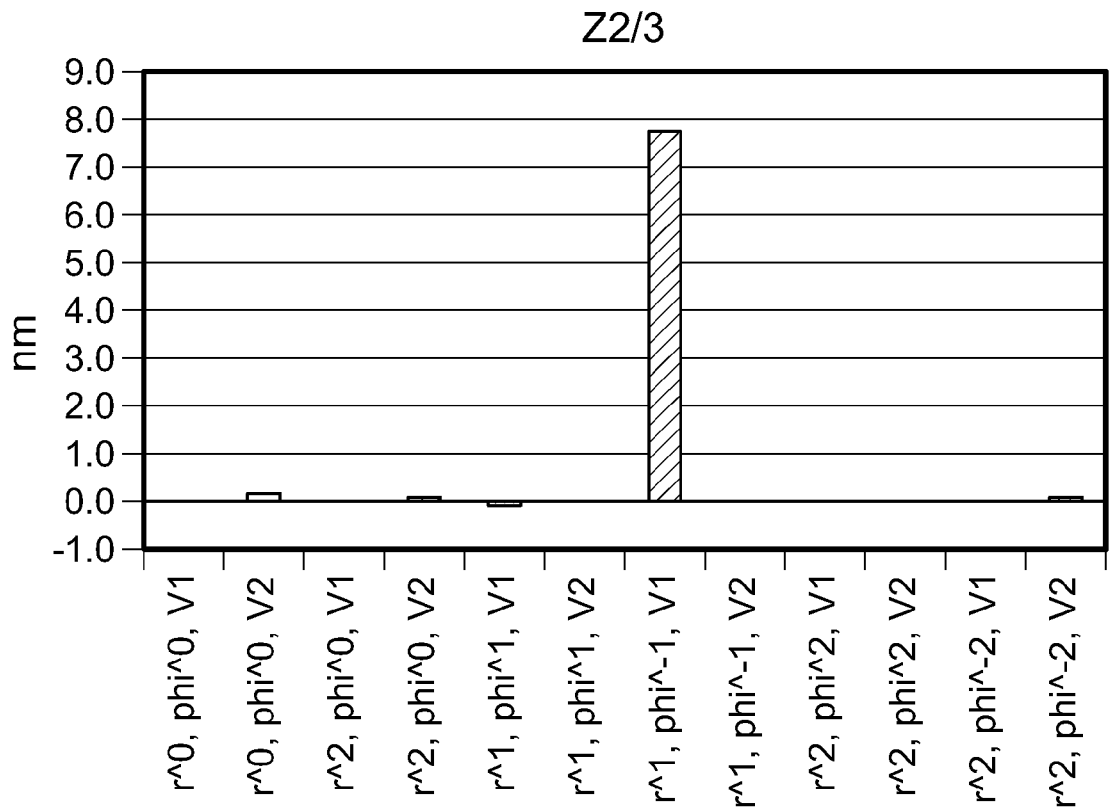
FIG. 12 shows in 12A and 12B diagrams indicating that the correction plate induces an anamorphic distortion as a dominant field aberration.
Figure 12B:
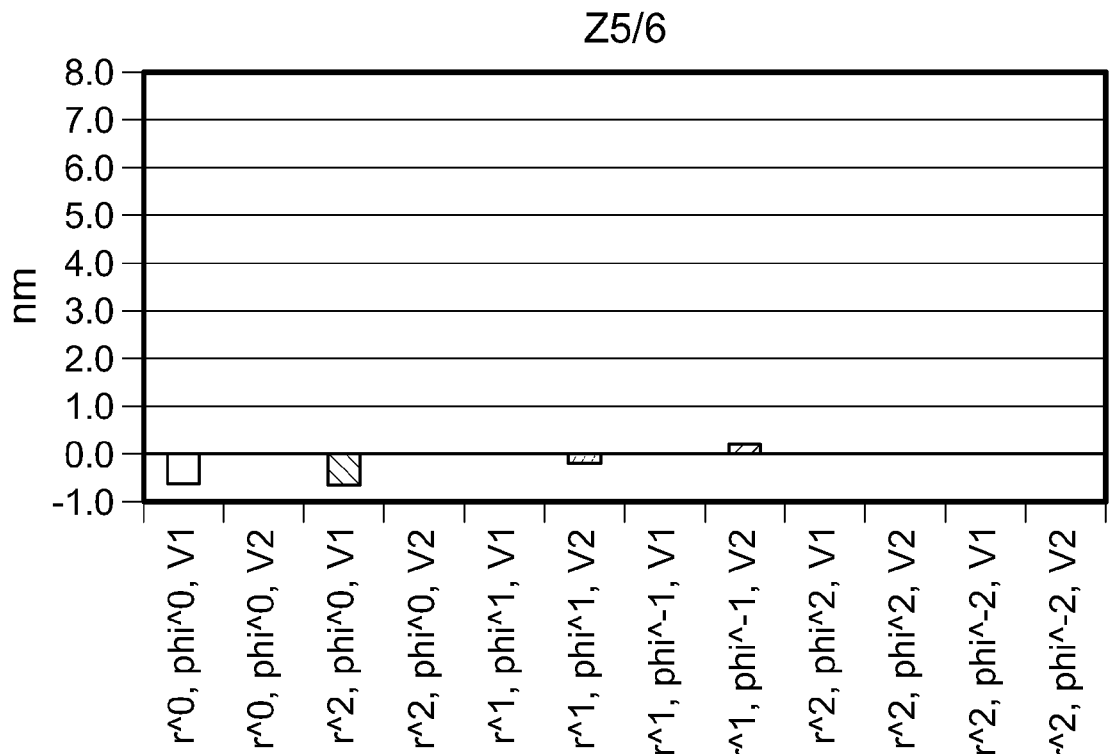

The dominance of the induced field-dependent distortion over other (parasitic) aberrations caused by the correction plate is illustrated in FIGS. 12A and 12B in a similar way as shown in FIG. 8A, 8B for the first exemplary embodiment. Again the contributions of field aberrations other than the anarmorphotic distortion (about 7.8 nm) are some orders of magnitude smaller than the contribution of the dominant field aberration.

The situation may also be described in a different way as follows:

The deformation of the reticle R in FIG. 10A is dominated by a saddle-shaped deformation as indicated qualitatively in FIG. 2. It is now not only α, but also β that are selected to be approximately equal to 1, and otherwise the peak-to-valley value and shape of the aspheres are kept the same as in the first exemplary embodiment. The desired effect then likewise occurs here that the pupil errors induced by the two aspheres compensate one another and, because of the field-dependent variation in the angles of the light bundles, there is a field profile of the distortion of the pupil that is precisely suitable for compensating the error induced by the distortion of the reticle.

What was the in the first exemplary embodiment for the additional asphere or the two additional aspheres is also valid for this exemplary embodiment.

In the case of both exemplary embodiments, it is possible, depending on the type of the mutually compensating aspherizations, to generate various field errors that are all free from pupil errors.

With increasing peak-to-valley (PV) of the aspherizations, the dominance of the field aberration increases until it becomes strong or even total. Here, it is also possible to implement yet further graduations with values of 2000, 5000 or even 10 000%, depending on aspherization.

The same holds for the pupil error (pupil aberration) which can be independently achieved.

Depending on the type of field profile, the aspheres can have azimuthally twofold or threefold or fourfold or manifold shapes or superpositions thereof.

All manipulators with an effect on optical elements of the projection objective are suitable as additionally complementary degrees of freedom for the correction. For example, optical elements such as lenses and/or mirrors that can be displaced, rotated, deformed, exchanged, cooled or heated.

Likewise, influences exerted on the operating wavelength λ of the projection exposure machine, or a modification of the illumination setting, can serve as additional degrees of freedom for the correction.

The correction method is particularly suitable for correcting the image errors when adjusting to a new reticle, when changing a process parameter such as, for example, the exposure period or the scanning speed, or in the case of a varying ambient air temperature.

It is therefore desirable for the plane plates PP or correction plates CP to be exchangeable, and for a number of plates with aspheres specifically adjusted in each case to the problems represented above to be held in store. The correction plates with aspheres can then, if involved, be inserted into the projection objective and resulting residual errors (residual aberrations) may additionally be corrected by the above specified possibilities of manipulation.

Figure 13:
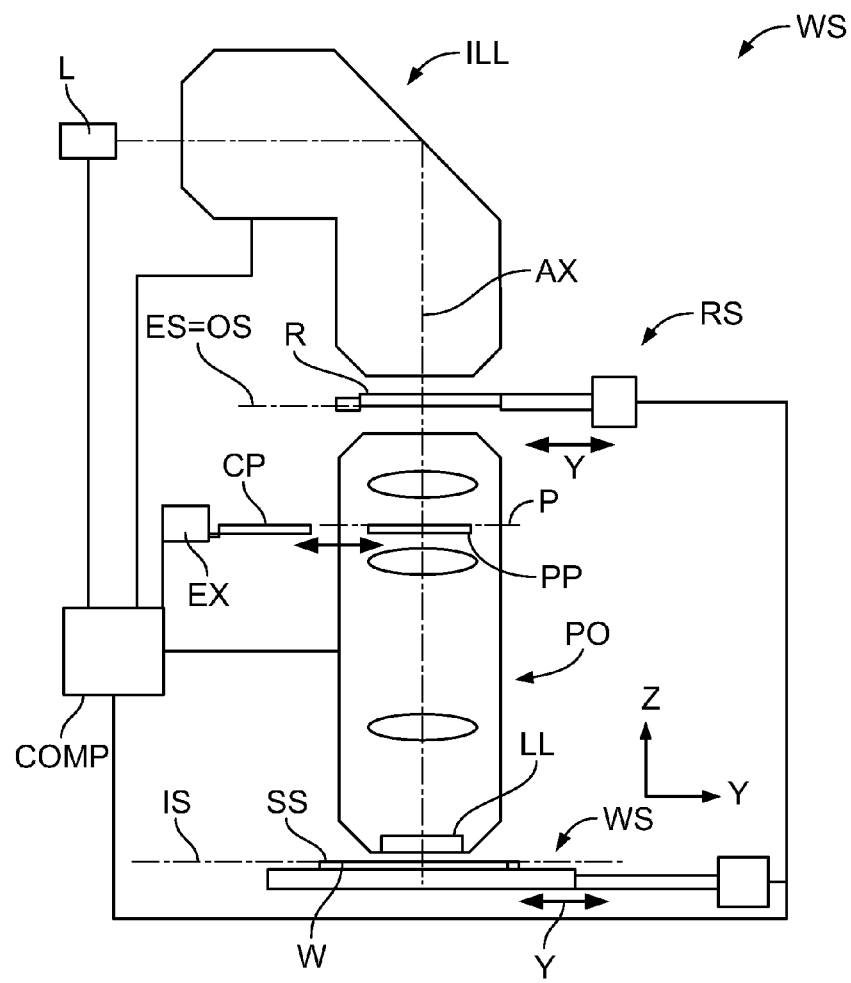
FIG. 13 shows a schematic drawing of a projection exposure apparatus for microlithography including a projection objective and an exchanging device for correction plates.

FIG. 13 shows schematically a microlithography projection exposure apparatus in the form of a wafer scanner WS, which is provided for fabricating large scale integrated semiconductor components in a step-and-scan mode. The projection exposure apparatus includes as light source an ArF excimer laser L having an operating wavelength of about 193 nm. Other operating wavelengths are also possible in other embodiments. A illumination system ILL arranged downstream of the lightsource generates, in its exit surface ES, a large, sharply delimited, homogeneously illuminated illumination field that is adapted to the desired telecentric properties of the projection objective PO, which is arranged optically downstream of the illumination system. The illumination system ILL has devices for selection of the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask or reticle R in such a way that a pattern formed on the mask lies in the exit surface ES of the illumination system coinciding with the object surface OS of the projection objective PO and can be moved in this plane for a scanning operation in a scanning direction (Y-direction) perpendicular to the optical axis AX common to the illumination system and the projection objective (i.e. the Z-direction).

The reduction projection objective PO is designed to image an image of a pattern provided by the mask with a reduced scale of 4:1 onto a wafer W coated with a photoresist layer. The wafer W serving as a light-sensitive substrate is arranged in such a way that the planar substrate surface SS with the photoresist layer essentially coincides with the planar image surface IS of the projection objective. The wafer is held by a device WS (wafer stage) including a scanner drive in order to move the wafer synchronously with the mask M in parallel with the latter. The device WS also includes manipulators in order to move the wafer both in the Z direction parallel to the optical axis and in the X and Y directions perpendicular to the axis. A tilting device having at least one tilting axis running perpendicular to the optical axis is integrated.

The projection objective PO has a flat, planoconvex last lens LL as the last optical element nearest to the image surface IS, the planar exit surface of the last lens being the last optical surface (exit surface) of the projection objective PO.

The exposure apparatus is configured for dry lithography. A small gap filled with a gas is formed between the exit surface of the projection objective and the substrate surface. Other embodiments are configured for immersion lithography and include an immersion medium guiding system to guide a transparent, high index immersion liquid into a small gap between the exit surface of the projection objective and the substrate such that the immersion liquid completely covers the substrate surface of the wafer at least in the region under exposure and that the exit-side end area of the projection objective is immersed into the immersion liquid while a finite image-side working distance is set correctly.

The entire system is controlled by a central computer COMP.

The projection objective PO in the original design includes a plane parallel plate PP arranged in a pupil space around a pupil surface P. An exchanging device EX operatively coupled to the central computer COMP is configured to hold one or more correction plates CP according to embodiments of the disclosure. Specifically, each correction plate may have rotationally asymmetric aspheric entry and exit surfaces with similar aspherization, each capable of inducing (or compensating for) a specific field-dependent distortion. The exchanging device EX is configured to replace the plane plate by one of the correction plates or to exchange a first correction plate by a second correction plate having different optical function, in response to signals received by the central computer.

In one mode of operation the control system is configured to exchange correction plates in a coordinated way when first mask (reticle) is exchanged for a second mask different from the first mask. While the reticle stage is performing the reticle change, the exchanging device may be controlled to exchange a first plate for a second plate, wherein at least one of the first and second plates is an optical correction plate according to an exemplary embodiment of the disclosure. The optical effect of the correction plate inserted at or near the pupil surface is adapted to the specific reticle such that distortion errors originating, for example, from a gravity driven sagging of the reticle are compensated.

The step of adjusting imaging characteristics of the projection objective by inserting a correction plate into a projection beam path or by removing a correction plate from the projection beam path between an entry surface and an exit surface of the projection objective may be performed at any suitable time, for example before a mask is changed, or during a mask change, or after a new mask has been put in place, prior to the exposure performed with the new mask.

Reticle bending induced by gravity and/or mounting forces is not the only possible source of distortion errors generated by non-ideal conditions at the reticle.

Distortion-like errors may also be generated by manufacturing inaccuracies during manufacturing of a mask. In general, a pattern to be formed on a mask should have a specified geometrical structure defining, for example, the number and orientation and widths of lines and/or other structures of the pattern. Typically, the exact positions of geometrical features are determined with respect to alignment marks present on the body of the mask. Where the actual position of a structural feature of a pattern deviates from a desired position, this inaccuracy may be treated as a distortion-like error, e.g. as a relative displacement between a desired position of a structural feature and the actual position. Distortion-like errors generated during manufacturing of a mask or generated by other conditions, are generally undesirable. For example, the properties towards minimizing distortion-like errors are increasing in applications where double patterning processes are used to increase the resolution of a microlithographic process.

Where a distortion-like error of a mask generated by manufacturing inaccuracies is present, such error may be compensated by utilizing an optical correction plate as described above. In the following, another option to reduced distortion-like errors will now be described.

In some semiconductor device manufacturing processes, a reticle (mask) is protected by a protective cover including a pellicle. For example, a pellicle may be provided on the pattern side of a mask at a small distance from the pattern to prevent dust and other foreign substances from depositing on the mask. A pellicle may be configured as a pellicle film, i.e. a film made from a material transparent to the operating radiation and held in a frame, or by a thin, rigid plate-like optical element, for example made of fused silica. Where a pellicle is provided at a distance from the pattern, each dust or other particle depositing on the outside of the pellicle will be arranged at a distance outside of the object surface of the projection objective when the pattern arranged on the mask is arranged in the object surface. Therefore, the image of the pattern projected by the projection objective on onto wafer substrate is not negatively influenced by dust particles or the like because those particles are not at the right position to be focused on the substrate. Therefore, utilizing pellicles to protect mask patterns generally improves the output in semiconductor device production process.

In those processes mask arrangements are used where the mask arrangement includes: a mask having a mask body and a pattern provided on a surface of the mask body; a pellicle having a transparent pellicle body arranged at a distance from the pattern; and a holding structure configured to fix the pellicle in a predetermined position relative to the mask.

It has been recognized that the pellicle can be used to compensate for distortion-like errors generated by inaccuracies during manufacturing of the pattern on the mask body. To this end, a method of manufacturing a mask arrangement includes:

measuring a pattern structure to generate pattern data representing the actual structure of the pattern formed on the mask body;

generating from the pattern data distortion data representing relative displacements of structural features of the pattern from corresponding structural features of a reference pattern, where the reference pattern represents an ideal (desired) pattern structure without manufacturing errors.

The method further includes the step of processing at least one surface of the pellicle body based on the distortion data to generate an aspheric surface profile effective to compensate at least partly distortion components caused by relative displacement of structural features of the pattern relative to corresponding structural features of the reference pattern.

Optionally, the aspheric surface profile is rotationally asymmetric, i.e. has no rotational symmetry.

When the processed pellicle is fixed by the holding structure in a predefined position relative to the mask on the pattern side thereof, then the combination of the mask and the aspherized pellicle can be an optical equivalent to a mask having substantially no distortion errors due to the manufacturing process. With other words: the pellicle acts in a way of a spectacle or correction lens to compensate for the manufacturing errors such that the projection objective "sees" a perfect mask, i.e. a mask appearing to have a (real) pattern identical to the (ideal) reference pattern.

The aspheric surface profile of the pellicle may be configured such that substantially the entire distortion error generated by inaccuracies of mask production is compensated. It is also possible to analyze the distortion data and to subdivide the contributions to overall distortion into first contributions which may be compensated for by manipulations of the projection objective, and second contributions which may not be compensated for by modifying the imaging characteristics of the projection objective. In this case, the first contributions may be compensated for by adjusting the imaging characteristics of the projection objective, whereas the second contributions may be utilized to generate data which are then used to shape the surface profile of an aspheric surface of the pellicle to compensate those second contributions. The first contributions may be used to generate control signals for one or more manipulators acting on the projection objective to change the imaging characteristics thereof.

In an alternative exemplary embodiment, the distortion data derived from the measurement of the manufactured pattern of the mask are exclusively used to generate control signals which are then utilized to adjust the imaging characteristics of the projection objective to compensate the measured distortion errors. In this case, no aspheric pellicle may be desirable.

The measuring step used to generate the pattern data may be performed by any appropriate measuring technique. For example US 2006/0274934 A1 describes a measuring system suitable for this purpose.

A system as described may also include a specified processing apparatus configured to process one or more surfaces of a pellicle to generate an aspheric surface profile effective to compensate distortion-like errors as described. The machine may include a control unit configured to receive the distortion data derived from a measurement, or signals derived from those distortion data, and to process optical surfaces based on those data. In an exemplary embodiment, the processing apparatus includes an ion beam source such that aspheric surface shapes can be generated by controlled, localized material removal with one or more ion beams (ion beam figuring). Conventional ion beam figuring machines may be modified for this purpose to be capable to be operated in response to control data derived from the measurements of reticle patterns.

Figure 14:
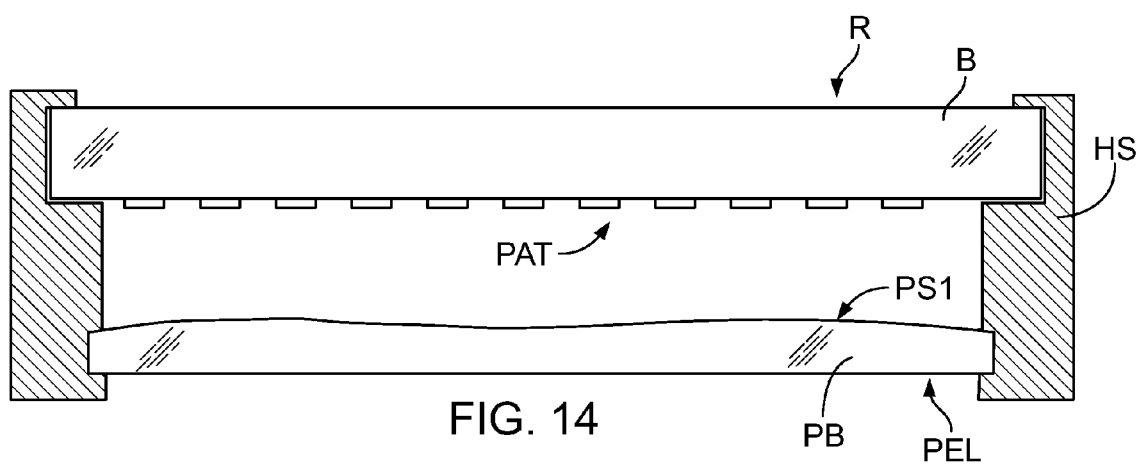
FIG. 14 shows schematically a mask arrangement including a mask and a pellicle having an aspheric surface shaped to correct distortion-like aberrations caused by manufacturing errors during production of the pattern of the mask.

FIG. 14 shows schematically a mask arrangement manufactured by the described method. The mask arrangement includes a mask or reticle R, having a mask body B and a pattern PAT provided on an essentially planar surface of the mask body, a pellicle PEL having a transparent pellicle body PB arranged at a distance from the pattern; and a holding structure HS configured to fix the pellicle in a predetermined position relative to the mask on the pattern side of the mask body. The pellicle surface PS1 facing the mask has a rotationally asymmetric surface profile effective to compensate at least partly distortion components caused by relative displacement of structural features of the pattern relative to corresponding structural features of a reference pattern representing the ideal position and geometry of a desired pattern. Pellicle surface PS1 has been figured (shaped) by localized material removal in an ion beam processing apparatus based on control data derived from a measurement of the structure of the real pattern PAT and a comparison of the respective pattern data obtained from the measurement with reference data representing the reference pattern. Alternatively, or in addition, the opposite pellicle surface (facing away from the pattern) may be aspherized. In general, the comparison yields distortion data representing relative displacements of structural features of the pattern from corresponding structural features of a reference pattern.

The above description has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof.

What is claimed is:

1. A projection objective comprising:
a plurality of optical elements arranged to image a pattern from an object field in an object surface of the projection objective to an image field in an image surface of the projection objective with electromagnetic radiation from a wavelength band around an operating wavelength $\lambda$, the plurality of optical elements comprising:
an optical correction plate comprising a body comprising a material transparent to the radiation, the body having a first optical surface, a second optical surface, and a plate normal substantially perpendicular to the first and second optical surfaces, wherein:
the first optical surface has a non-rotationally symmetric aspheric first surface profile with a first peak-to-valley value $PV1 > \lambda$;
the second optical surface has a non-rotationally symmetric aspheric second surface profile with a second peak-to-valley value $PV2 > \lambda$; and
a thickness of the optical correction plate varies by less than $0.1*(PV1+PV2)/2$ across the optical correction plate.

2. The projection objective according to claim 1, wherein $PV1 > 5*\lambda$ and $PV2 > 5/\lambda$.

3. The projection objective according to claim 1, wherein each of the first and second surface profiles has substantially n-fold radial symmetry with respect to a symmetry axis parallel to the plate normal, where $n \geq 2$ and n is an integer.

4. The projection objective according to claim 1, wherein each of the first and second optical surfaces has a saddle-shape with a positive first curvature in a first direction perpendicular to the plate normal and a negative curvature in a second direction perpendicular to the plate normal and to the first direction.

5. The projection objective according to claim 1, wherein the thickness of the optical correction plate varies by less than $0.05*(PV1+PV2)/2$ across the optical correction plate.

6. The projection objective according to claim 1, wherein the optical correction plate has a thickness profile defined as a distance between the first and second optical surfaces measured parallel to the plate normal, and the thickness profile of the optical correction is non-uniform.

7. The projection objective according to claim 1, wherein the thickness of the optical correction plate varies by more than 10 nm across the optical correction plate.

8. The projection objective according to claim 1, wherein the optical correction plate has a thickness profile defined as a distance between the first and second optical surfaces measured parallel to the plate normal, and the thickness profile of the optical correction is non-uniform with a substantially n-fold radial symmetry with respect to a symmetry axis parallel to the plate normal, where $n \geq 2$, and n is an integer.

9. The projection objective according to claim 1, wherein the first surface profile and the second surface profiles are adapted to a ray profile of a projection beam passing between the object field and the image field at a position of the optical correction plate such that the first and second optical surface in combination induce a dominant field aberration.

10. The projection objective according to claim 9, wherein the dominant field aberration is a field-variable distortion.

11. The projection objective according to claim 9, wherein the dominant field aberration is an anamorphic distortion.

12. The projection objective according to claim 1, wherein the optical correction plate is arranged in a position optically remote from a field surface of the projection objective.

13. The projection objective according to claim 1, wherein at least one of the optical elements is arranged between the optical correction plate and a closest field surface.

14. The projection objective according to claim 1, wherein a pupil space is defined around a pupil surface of the projection objective in a region where an absolute value of a paraxial sub-aperture ratio SAR is in a range $0.8 \leq |SAR| \leq 1$, and the optical correction plate is arranged in the pupil space.

15. The projection objective according to claim 14, wherein the optical correction plate is arranged at a pupil surface of the projection objective such that the first and the second optical surfaces are arranged at positions characterized by opposite signs of a paraxial sub-aperture ratio SAR.

16. The projection objective according to claim 1, wherein the optical correction plate is arranged in a region of divergent or convergent beam of radiation.

17. The projection objective according to claim 1, wherein the first surface profile and the second surface profile are adapted to a ray profile of a beam of radiation passing between the object field and the image field at a position of the optical correction plate such that the first and second optical surfaces in combination induce a dominant field aberration and a pupil aberration.

18. The projection objective according to claim 1, wherein the projection objective is configured to be used in a microlithography projection exposure apparatus.

19. An apparatus, comprising:
an illumination system; and
a projection objective according to claim 1,
wherein the apparatus is a projection exposure apparatus.

20. An article, comprising:
a body comprising a material transparent to radiation with an operating wavelength $\lambda > 100$ nm, the body having a first optical surface, a second optical surface, and a plate normal substantially perpendicular to the first and second optical surfaces, wherein:
the first optical surface has a non-rotationally symmetric aspheric first surface profile with a first peak-to-valley value $PV1 > \lambda$;
the second optical surface has a non-rotationally symmetric aspheric second surface profile with a second peak-to-valley value $PV2 > \lambda$;
the article has a non-uniform thickness profile; and
the article is an optical correction plate.

* * * * *

UNITED STATES PATENT AND TRADEMARK OFFICE
CERTIFICATE OF CORRECTION

PATENT NO. : 8,228,483 B2
APPLICATION NO. : 12/698242
DATED : July 24, 2012
INVENTOR(S) : Ulrich Loering et al.

It is certified that error appears in the above-identified patent and that said Letters Patent is hereby corrected as shown below:

Column 3, line 49, after "the" insert --disclosure--;

Column 9, line 3, delete "ration" insert --ratio--;

Column 9, line 43, delete "trans-formed" insert --transformed--;

Column 10, line 17, delete "$w_p(p, z)$" insert --$w_p(p, q)$--;

Column 10, line 64, delete "$\{\alpha_{ij}; i \varepsilon N, j \varepsilon m\},...$" insert --$\{\alpha_{ij}; i \varepsilon N, j \varepsilon M\},...$--;

Column 11, line 15, after "system" insert --.--;

Column 11, line 36, delete "$+ \sum_{i=4}^{n} \sum_{j=1}^{m} \alpha_{ij} Z_i(p) Z_j(q),,$" insert --$+ \sum_{i=4}^{n} \sum_{j=1}^{m} \alpha_{ij} Z_i(p) Z_j(q),$--;

Column 11, line 36, delete "III" insert --III,--;

Column 11, line 58, delete "summands" insert --summand--;

Column 12, line 25, delete "distortion," insert --distortion.--;

Column 12, line 50, after "azimuthally" insert --.--;

Column 16, line 27, delete "direction." insert --direction).--;

Column 16, line 63, delete "FIG. 6a." insert --FIG. 6A.--;

Column 18, line 56, delete "FIG. 6b." insert --FIG. 6B.--;

Column 24, line 31, delete "anarmorphotic" insert --anamorphic--;

Column 25, line 29, delete "lightsource" insert --light source--;

Column 29, line 32, Claim 2, delete "PV2>5/λ.--" insert --PV2>5* λ--;

Column 30, line 2, Claim 9, delete "profiles" insert --profile--.

Signed and Sealed this
Second Day of October, 2012

David J. Kappos
*Director of the United States Patent and Trademark Office*